US012796116B2

(12) United States Patent
Kumaki

(10) Patent No.: US 12,796,116 B2
(45) Date of Patent: Nov. 10, 2026

(54) PHOTOELECTRIC CONVERSION DEVICE FOR PERFORMING READING OPERATIONS

(71) Applicant: CANON KABUSHIKI KAISHA, Tokyo (JP)

(72) Inventor: Satoshi Kumaki, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 696 days.

(21) Appl. No.: 18/186,771

(22) Filed: Mar. 20, 2023

(65) Prior Publication Data

US 2023/0307483 A1 Sep. 28, 2023

(30) Foreign Application Priority Data

Mar. 24, 2022 (JP) ................................. 2022-047961

(51) Int. Cl.
*H10F 39/18* (2025.01)
*H04N 25/626* (2023.01)
(Continued)

(52) U.S. Cl.
CPC ........... *H10F 39/18* (2025.01); *H04N 25/626* (2023.01); *H04N 25/772* (2023.01);
(Continued)

(58) Field of Classification Search
CPC .. H10F 39/18; H10F 39/8063; H10F 39/8037; H10F 39/811; H10F 39/813; H04N 25/626; H04N 25/772
See application file for complete search history.

(56) References Cited

U.S. PATENT DOCUMENTS

2014/0176682 A1* 6/2014 Iwasaki .................. G03B 35/08 348/49
2016/0337567 A1 11/2016 Okura
(Continued)

FOREIGN PATENT DOCUMENTS

JP 2016219857 A 12/2016
JP 2019135815 A 8/2019
(Continued)

*Primary Examiner* — Norman D Richards
*Assistant Examiner* — Sean Ayers Winters
(74) *Attorney, Agent, or Firm* — Canon U.S.A., Inc. IP Division

(57) ABSTRACT

A photoelectric conversion device includes a first photoelectric conversion element, a second photoelectric conversion element, a microlens that guides incident light to the first photoelectric conversion element and the second photoelectric conversion element, a floating diffusion to which charges accumulated in at least one of the first photoelectric conversion element and the second photoelectric conversion element are transferred, and a transistor that, when switched on, adds a capacitance to a node of the floating diffusion. First and second reading operations are performed. In the first reading operation, a signal based on charges transferred to the floating diffusion is read at a first conversion gain caused by a state where the transistor is in an off-state. In the second reading operation, a signal based on charges transferred to the floating diffusion is read at a second conversion gain caused by a state where the transistor is in an on-state.

22 Claims, 15 Drawing Sheets

(51) Int. Cl.
*H04N 25/772* (2023.01)
*H10F 39/00* (2025.01)

(52) U.S. Cl.
CPC ..... *H10F 39/8037* (2025.01); *H10F 39/8063* (2025.01); *H10F 39/811* (2025.01); *H10F 39/813* (2025.01)

(56) References Cited

U.S. PATENT DOCUMENTS

| | | | | |
|---|---|---|---|---|
| 2019/0191109 | A1 | 6/2019 | Mo | |
| 2019/0246054 | A1 * | 8/2019 | Kobayashi | H04N 25/583 |
| 2021/0099659 | A1 * | 4/2021 | Miyauchi | H04N 25/583 |
| 2021/0185251 | A1 | 6/2021 | Yonemoto | |
| 2022/0060647 | A1 * | 2/2022 | Lee | H04N 25/59 |

FOREIGN PATENT DOCUMENTS

| | | | |
|---|---|---|---|
| JP | 2020039017 | A | 3/2020 |
| JP | 2021022921 | A | 2/2021 |
| JP | 2021057795 | A | 4/2021 |
| JP | 2021097241 | A | 6/2021 |
| JP | 2022036068 | A | 3/2022 |
| JP | 2022043846 | A | 3/2022 |
| WO | 2021166584 | A1 | 8/2021 |

* cited by examiner

PHOTOELECTRIC CONVERSION DEVICE FOR PERFORMING READING OPERATIONS

BACKGROUND

Technical Field

The present disclosure relates to a photoelectric conversion device.

Description of the Related Art

Japanese Patent Application Laid-Open No. 2019-135815 discloses a photoelectric conversion device having a pixel in which a plurality of photoelectric conversion units or elements are arranged for each microlens. The photoelectric conversion device of Japanese Patent Application Laid-Open No. 2019-135815 can output signals used for focus detection performed on an image capturing plane. Further, the photoelectric conversion device of Japanese Patent Application Laid-Open No. 2019-135815 can expand the dynamic range by amplifying signals output from pixels at a plurality of different gains and outputting the amplified signals.

Japanese Patent Application Laid-Open No. 2016-219857 discloses a photoelectric conversion device having a pixel that can change the capacitance of a floating diffusion to which charges are transferred from a photoelectric conversion unit or element. The photoelectric conversion device of Japanese Patent Application Laid-Open No. 2016-219857 can expand the dynamic range by reading a plurality of signals resulted from different capacitances of the floating diffusion.

In a photoelectric conversion device that can output signals for focus detection as with Japanese Patent Application Laid-Open No. 2019-135815, there is a demand for a scheme that may more suitably expand the dynamic range.

SUMMARY

The present disclosure intends to provide a photoelectric conversion device that has a pixel capable of outputting a signal used for focus detection and may more suitably expand the dynamic range.

According to a disclosure of the present specification, a photoelectric conversion device includes a plurality of pixels and a signal line. Each of the pixels includes a first photoelectric conversion element, a second photoelectric conversion element, a micro-lens that guides incident light to the first photoelectric conversion element and the second photoelectric conversion element, a floating diffusion to which charges accumulated in at least one of the first photoelectric conversion element and the second photoelectric conversion element are transferred, and a transistor that, when switched on, adds a capacitance to a node of the floating diffusion. Signals are read from the plurality of pixels to the signal line. In a second period after a first period in which a signal is read to the signal line from one subset of the plurality of pixels, a signal is read to the signal line from another subset of the plurality of pixels. In the first period, a first reading operation and a second reading operation are performed. In the first reading operation, signal based on charges transferred to the floating diffusion is read at a first conversion gain caused by a state where the transistor is in an off-state. In the second reading operation, a signal based on charges transferred to the floating diffusion is read at a second conversion gain caused by a state where the transistor is in an on-state.

According to a disclosure of the present specification, a photoelectric conversion device includes a first photoelectric conversion element, a second photoelectric conversion element, a micro-lens that guides incident light to the first photoelectric conversion element and the second photoelectric conversion element, a floating diffusion to which charges accumulated in at least one of the first photoelectric conversion element and the second photoelectric conversion element are transferred, and a transistor that, when switched on, adds a capacitance to a node of the floating diffusion. In a period from a time that resetting of the floating diffusion is canceled to a time that resetting of the floating diffusion is next performed, a first reading operation and a second reading operation are performed. In the first reading operation, a signal based on charges transferred to the floating diffusion is read at a first conversion gain caused by a state where the transistor is in an off-state. In the second reading operation, a signal based on charges transferred to the floating diffusion is read at a second conversion gain caused by a state where the transistor is in an on-state.

Further features of the disclosure will become apparent from the following description of exemplary embodiments with reference to the attached drawings.

DESCRIPTION OF THE EMBODIMENTS

Figure 1:
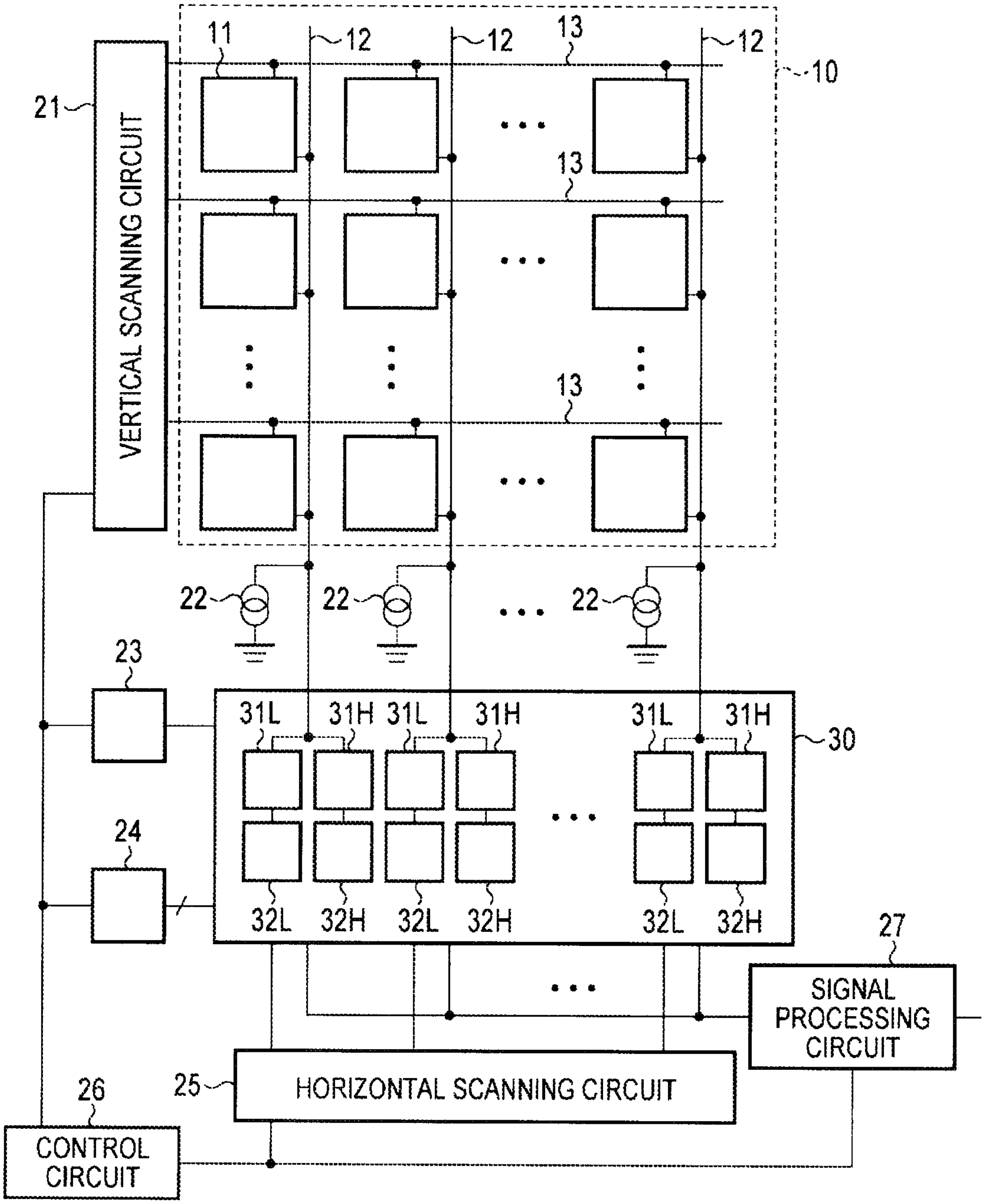
FIG. 1 is a block diagram illustrating a general configuration of a photoelectric conversion device according to a first embodiment.

Preferred embodiments of the disclosure will now be described in detail in accordance with the accompanying drawings. The same elements or corresponding elements are labeled with the same reference throughout a plurality of drawings, and the description thereof may be omitted or simplified. In the following, the term "unit" may refer to a software context, a hardware context, or a combination of software and hardware contexts. In the software context, the term "unit" refers to a functionality, an application, a software module, a function, a routine, a set of instructions, or a program that can be executed by a programmable processor such as a microprocessor, a central processing unit (CPU), or a specially designed programmable device or controller. A memory contains instructions or program that, when executed by the CPU, cause the CPU to perform operations corresponding to units or functions. In the hardware context, the term "unit" refers to a hardware element, a circuit, an assembly, a physical structure, a system, a module, or a subsystem. It may include mechanical, optical, or electrical components, or any combination of them. It may include active (e.g., transistors) or passive (e.g., capacitor) components. It may include semiconductor devices having a substrate and other layers of materials having various concentrations of conductivity. It may include a CPU or a programmable processor that can execute a program stored in a memory to perform specified functions. It may include logic elements (e.g., AND, OR) implemented by transistor circuits or any other switching circuits. In the combination of software and hardware contexts, the term "unit", "element" or "circuit" refers to any combination of the software and hardware contexts as described above. In addition, the term "element," "assembly," "component," or "device" may also refer to "circuit" with or without integration with packaging materials. Furthermore, depending on the context, the term "portion," "part," "device," "switch," or similar terms may refer to a circuit or a group of circuits. The circuit or group of circuits may include electronic, mechanical, or optical elements such as capacitors, diodes, transistors. For example, a switch is a circuit that turns on and turns off a connection. It can be implemented by a transistor circuit or similar electronic devices.

In a first embodiment to a fourth embodiment described below, an imaging device will be described mainly as an example of photoelectric conversion devices. However, the photoelectric conversion device in each embodiment is not limited to an imaging device and is applicable to other photodetection devices. An example of other devices may be a ranging device, a photometric device, or the like. The ranging device may be, for example, a focus detection device, a distance measuring device using Time-Of-Flight (TOF), or the like. The photometric device may be a device for measuring a light amount of light entering the device.

First Embodiment

FIG. 1 is a block diagram illustrating the general configuration of a photoelectric conversion device according to the present embodiment. The photoelectric conversion device has a pixel array 10, a vertical scanning circuit 21, a current source 22, a reference signal generation circuit 23, a counter 24, a horizontal scanning circuit 25, a control circuit 26, a signal processing circuit 27, and an analog-to-digital (AD) conversion unit or circuit 30.

The control circuit 26 is a control circuit for supplying the vertical scanning circuit 21, the reference signal generation circuit 23, the counter 24, the horizontal scanning circuit 25, and the signal processing circuit 27 with control signals for controlling the operations and timings thereof. At least some of the control signals supplied to the vertical scanning circuit 21, the reference signal generation circuit 23, the counter 24, the horizontal scanning circuit 25, and the signal processing circuit 27 may be supplied from outside of the photoelectric conversion device.

The pixel array 10 has a plurality of pixels 11 arranged in a matrix over a plurality of rows and a plurality of columns. Each of the plurality of pixels 11 includes two photoelectric conversion elements each formed of a photoelectric conversion element such as a photodiode. Light guided by a single common microlens enters the two photoelectric conversion elements. The pixel 11 outputs a focus detection signal based on charges generated by one of a first photoelectric conversion unit or element and a second photoelectric conversion unit or element and a mixed signal based on charges generated by both the first photoelectric conversion element and the second photoelectric conversion element. The mixed signal may be used for generation of an image. Further, the pixel 11 outputs a reset signal based on a reset state of the pixel 11. Further, the pixel 11 can be switched between at least two types of states including a low gain (second conversion gain) state and a high gain (first conversion gain) state.

The overview of a drive method of the pixel 11 in the present embodiment will be described. When a signal from the first photoelectric conversion element is read, only a reading operation in a high gain state (first reading operation) is performed. Then, when a mixed signal from the first photoelectric conversion element and the second photoelectric conversion element is read, a reading operation in the high gain state (first reading operation) and a reading operation in the low gain state (second reading operation) are sequentially performed. With such a drive method, a reading operation of a focus detection signal and a reading operation of a mixed signal at two gains different from each other are implemented. Further, in the present embodiment, a reading operation of a reset signal in the low gain state and a reading operation of a reset signal in the high gain state (third reading operation) are performed before transfer of charges for a reading operation of a focus detection signal and a mixed signal. These reset signals may be used for correlated double sampling.

On each row of the pixel array 10, a plurality of control lines 13 are arranged extending in a first direction (the lateral direction in FIG. 1). Each of the plurality of control lines 13 is connected to the pixels 11 aligned in the first direction, respectively, to form a signal line common to these pixels 11. The first direction in which the control line 13 extends may be referred to as a row direction or a horizontal direction. The control lines 13 are connected to the vertical scanning circuit 21.

On each column of the pixel array 10, output lines 12 are arranged extending in a second direction (the perpendicular direction in FIG. 1) intersecting the first direction. Each of the output lines 12 is connected to the pixels 11 aligned in the second direction, respectively, to form a signal line common to these pixels 11. The second direction in which the output line 12 extends may be referred to as a column direction or a vertical direction. Each of the output lines 12 is connected to the AD conversion circuit 30 and the current source 22 arranged in association with each column.

The vertical scanning circuit 21 is a scanning circuit having a function of generating and supplying control signals for driving the pixels 11 to the pixels 11 via the control lines 13 in response to a control signal output from the control circuit 26. Logic circuits such as a shift register, an address decoder, or the like may be used for the vertical scanning circuit 21. The vertical scanning circuit 21 drives the pixels 11 of the pixel array 10 on a row basis. Signals read from the pixels 11 on a row basis are input to the AD conversion circuit 30 via the output lines 12 provided on respective columns of the pixel array 10.

The reference signal generation circuit 23 is a circuit that generates a reference signal to be supplied to the AD conversion circuit 30 in response to a control signal output from the control circuit 26. The reference signal may include a signal whose signal level (signal magnitude) changes with time, for example. The reference signal typically includes a ramp signal. The ramp signal is a signal whose signal level changes monotonically with time, which is a signal whose output voltage monotonically decreases or monotonically increases with time, for example. Note that the reference signal is not particularly limited as long as it has a change amount applicable to AD conversion.

The counter 24 counts the number of pulses of a clock signal and thereby generates and outputs a count signal whose value changes in accordance with time to the AD conversion circuit 30. Accordingly, the counter 24 counts a period that the control signal output from the reference signal generation circuit 23 changes.

The AD conversion circuit 30 has two sets of comparators 31 and memory circuits 32 on a column basis so as to be able to perform AD conversion on signals output at two types of gains and hold two digital signals. As illustrated in FIG. 1, the first set of the comparator 31 and the memory circuit 32 for a low gain may be denoted as a comparator 31L and a memory unit or circuit 32L, respectively, and the second set of the comparator 31 and the memory unit or circuit 32 for a high gain may be denoted as a comparator 31H and a memory unit or circuit 32H, respectively.

A plurality of unit memories (not illustrated) are arranged for each of the memory circuits 32L, 32H. Accordingly, each of the memory circuits 32L, 32H is configured to be able to hold digital signals, which are results of AD conversion on a reset signal, a focus detection signal, and a mixed signal, in a plurality of unit memories, respectively.

Each of the comparators 31L, 31H compares a signal output to a corresponding output line 12 with the reference signal output from the reference signal generation circuit 23. The comparators 31L, 31H each change the output signal thereof upon inversion of the relationship of potential levels. The memory circuits 32L, 32H hold count values being output from the counter 24 at the time that the output signals of the comparators 31L, 31H change.

Since the output of the reference signal generation circuit 23 changes in accordance with passage of time, count values corresponding to a change period is held in the memory circuits 32L, 32H, and thereby a digital signal in accordance with a signal output to the output line 12 can be held.

The horizontal scanning circuit 25 performs a scan to sequentially supply control signals to the memory circuits 32L, 32H on each column. Accordingly, digital signals held in the memory circuits 32L, 32H on each column are sequentially transferred to the signal processing circuit 27. The horizontal scanning circuit 25 may be formed using a shift register, an address decoder, or the like.

The signal processing circuit 27 processes digital signals output from the AD conversion circuit 30 and outputs the processed signals to outside of the photoelectric conversion device. The signal processing performed in the signal processing circuit 27 may be, for example, a subtraction process, an addition process, a correction process, or the like on a digital signal.

The signal processing that may be performed in the signal processing circuit 27 will be described in more detail. The signal processing circuit 27 subtracts a digital signal of a reset signal from digital signals of a focus detection signal and a mixed signal and outputs the resulted digital signals to outside of the photoelectric conversion device. Accordingly, a signal component in accordance with an incident light amount is extracted. At this time, a focus detection signal resulted after subjected to a subtraction process is a signal in accordance with an amount of light that has entered the first photoelectric conversion element. On the other hand, a mixed signal resulted after subjected to a subtraction process is a signal corresponding to an amount of light that has entered the first photoelectric conversion element and the second photoelectric conversion element and is used for generation of an image.

Further, the signal processing circuit 27 may calculate and output a signal in accordance with an amount of light that has entered the second photoelectric conversion element by subtracting a focus detection signal resulted after a subtraction process from a mixed signal resulted after the subtraction process. In this operation, any one of the signals read in the high gain state and the low gain state may be subjected to a subtraction process after converted into a signal corresponding to the gain of the other. For example, a signal read in the high gain state will be subjected to a correction process in accordance with the gain ratio and thereby converted into a signal corresponding to the low gain. By performing a subtraction process in this state, it is possible to calculate a signal in accordance with an amount of light that has entered the second photoelectric conversion element taking a difference in the gain into consideration.

In such a way, a focus detection signal in accordance with an amount of light that has entered the first photoelectric conversion element and a focus detection signal in accordance with an amount of light that has entered the second photoelectric conversion element are obtained. Focus detection can be performed through comparison between these focus detection signals. Further, for a mixed signal resulted after a subtraction process, two types of signals of a high gain signal and a low gain signal are output to outside of the photoelectric conversion device. At high illuminance, that is, when the signal level is high, the low gain signal is used for generation of an image. In contrast, at low illuminance, that is, when the signal level is low, only the high gain signal or both the high gain signal and the low gain signal are used for generation of an image. Since the high gain signal has a large potential change amount in the pixel 11, the influence of circuit noise occurring in a circuit downstream of the pixel 11 becomes relatively small. Therefore, with the use of a high gain signal, noise at low illuminance can be reduced, and an image with an expanded dynamic range can be generated.

Figure 2:
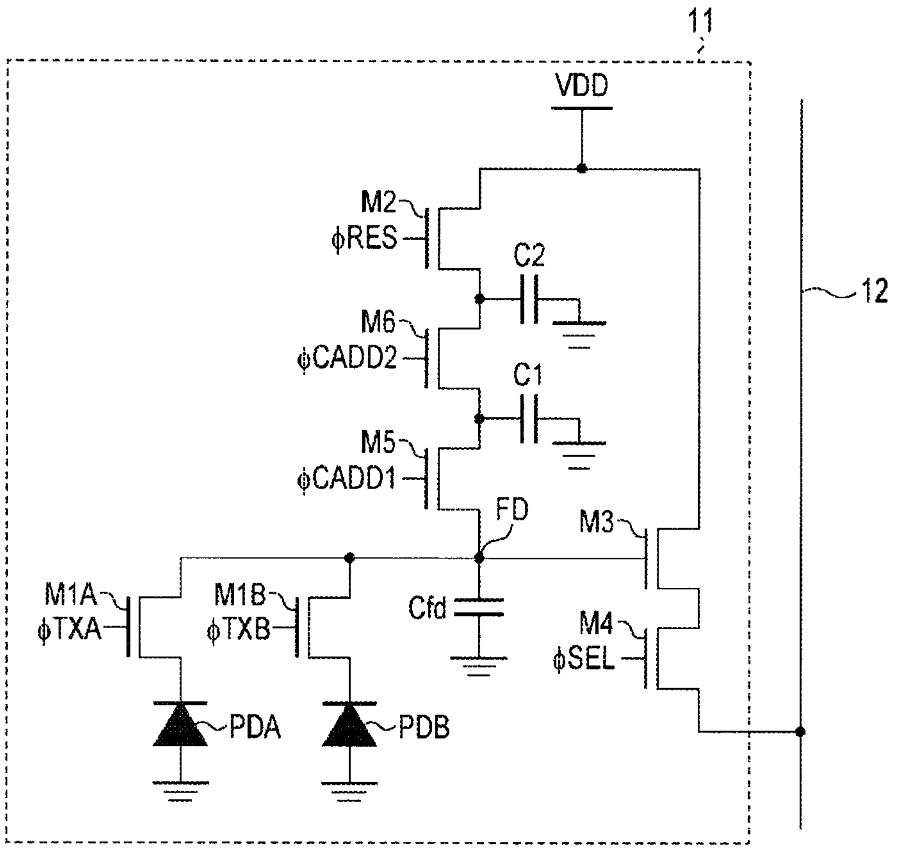
FIG. 2 is an element diagram illustrating a configuration of a pixel according to the first embodiment.

FIG. 2 is a circuit diagram illustrating the configuration of the pixel 11 according to the present embodiment. The pixel 11 has photoelectric conversion elements PDA, PDB, transfer transistors M1A, M1B, a reset transistor M2, an amplifier transistor M3, a selection transistor M4, and capacitance addition transistors M5, M6. The photoelectric conversion elements PDA and PDB correspond to the first photoelectric conversion element and the second photoelectric conversion element described above, respectively.

The photoelectric conversion elements PDA, PDB each are a photodiode, for example. The anodes of the photoelectric conversion elements PDA, PDB are connected to a ground node. The cathodes of the photoelectric conversion elements PDA, PDB are connected to the sources of the transfer transistors M1A, M1B, respectively. The drains of the transfer transistors M1A, M1B are connected to the source of the capacitance addition transistor M5 and the gate of the amplifier transistor M3. The node at which the drains of the transfer transistors M1A, M1B, the source of the capacitance addition transistor M5, and the gate of the amplifier transistor M3 are connected is a floating diffusion FD. That is, the floating diffusion FD is connected to the gate (control node) of the amplifier transistor M3.

The floating diffusion FD includes a capacitance component and has a function as a charge holding portion. The floating diffusion FD performs a charge-to-voltage conversion on charges generated by photoelectric conversion by the photoelectric conversion elements PDA, PDB. The coefficient of the charge-to-voltage conversion is determined by a capacitance Cfd formed of junction capacitances of a diffusion layer and a wiring forming the floating diffusion FD, a gate capacitance, an inter-wiring parasitic capacitance, and the like. In FIG. 2, the capacitance Cfd of the floating diffusion FD is equivalently indicated by a circuit symbol of a capacitor element.

The drain of the capacitance addition transistor M5 is connected to the source of the capacitance addition transistor M6. The drain of the capacitance addition transistor M6 is connected to the source of the reset transistor M2. The drain of the reset transistor M2 and the drain of the amplifier transistor M3 are connected to a power source voltage node supplied with a voltage VDD. The source of the amplifier transistor M3 is connected to the drain of the selection transistor M4. The source of the selection transistor M4 is connected to the output line 12.

Control signals ϕTXA, ϕTXB are input to the gates of the transfer transistors M1A, M1B via the control line 13 from the vertical scanning circuit 21, respectively. A control signal ϕRES is input to the gate of the reset transistor M2 via the control line 13 from the vertical scanning circuit 21. A control signal ϕSEL is input to the gate of the selection transistor M4 via the control line 13 from the vertical scanning circuit 21. Control signals ϕCADD1, ϕCADD2 are input to the gates of the capacitance addition transistors M5, M6 via the control line 13 from the vertical scanning circuit 21, respectively.

In the present embodiment, each transistor forming the pixel 11 is an N-type Metal Oxide Semiconductor (MOS) transistor. Therefore, when a high-level control signal is supplied from the vertical scanning circuit 21, a corresponding transistor is switched on. Further, when a low-level control signal is supplied from the vertical scanning circuit 21, a corresponding transistor is switched off. Further, names of the source and the drain of a MOS transistor may differ in accordance with the conductivity type of the transistor or a function of interest. Some or all of the names of the source and the drain used in the present embodiment may be denoted as the opposite names.

The photoelectric conversion elements PDA, PDB convert (photoelectrically convert) incident light into charges, the quantity of which corresponds to the light amount of the incident light, and accumulate the charges. When switched on, the transfer transistor M1A transfers charges held by the photoelectric conversion element PDA to the floating diffusion FD. When switched on, the transfer transistor M1B transfers charges held by the photoelectric conversion element PDB to the floating diffusion FD. The charges transferred from the photoelectric conversion elements PDA, PDB are held by the capacitor of the floating diffusion FD. As a result, the floating diffusion FD has a potential in accordance with the quantity of charges transferred from the photoelectric conversion elements PDA, PDB by the charge-to-voltage conversion due to the floating diffusion capacitance.

When switched on, the selection transistor M4 connects the amplifier transistor M3 to the output line 12. The amplifier transistor M3 is configured such that the voltage VDD is supplied to the drain and bias current is supplied to the source from the current source 22 via the selection transistor M4 and forms an amplifier unit or circuit in which the gate is the input node (source follower circuit). Accordingly, the amplifier transistor M3 outputs a signal based on the potential of the floating diffusion FD to the output line 12 via the selection transistor M4. In this sense, the amplifier transistor M3 and the selection transistor M4 correspond to an output unit or circuit that outputs a pixel signal in accordance with the quantity of charges held in the floating diffusion FD.

The reset transistor M2 has a function of controlling supply of the voltage (voltage VDD) to the floating diffusion FD to reset the floating diffusion FD. When all the reset transistor M2 and the capacitance addition transistors M5, M6 are switched on, the floating diffusion FD is reset to a voltage in accordance with the voltage VDD.

Further, when switched on, the capacitance addition transistors M5, M6 increase a capacitance connected to the floating diffusion FD and has a function of changing a conversion coefficient in charge-to-voltage conversion. In FIG. 2, capacitances C1, C2 added by the capacitance addition transistors M5, M6 are equivalently indicated by circuit symbols of capacitor elements.

When both the capacitance addition transistors M5, M6 are switched off, the capacitance at the node of the floating diffusion FD is "Cfd". When the capacitance addition transistor M5 is switched on and the capacitance addition transistor M6 is switched off, the capacitance at the node of the floating diffusion FD is "Cfd+C1". When both the capacitance addition transistors M5, M6 are switched on, the capacitance at the node of the floating diffusion FD is "Cfd+C1+C2". In such a way, the pixel 11 of the present embodiment is configured to be able to change the capacitance at the floating diffusion FD between three levels of "small", "medium", and "large".

Figure 3:
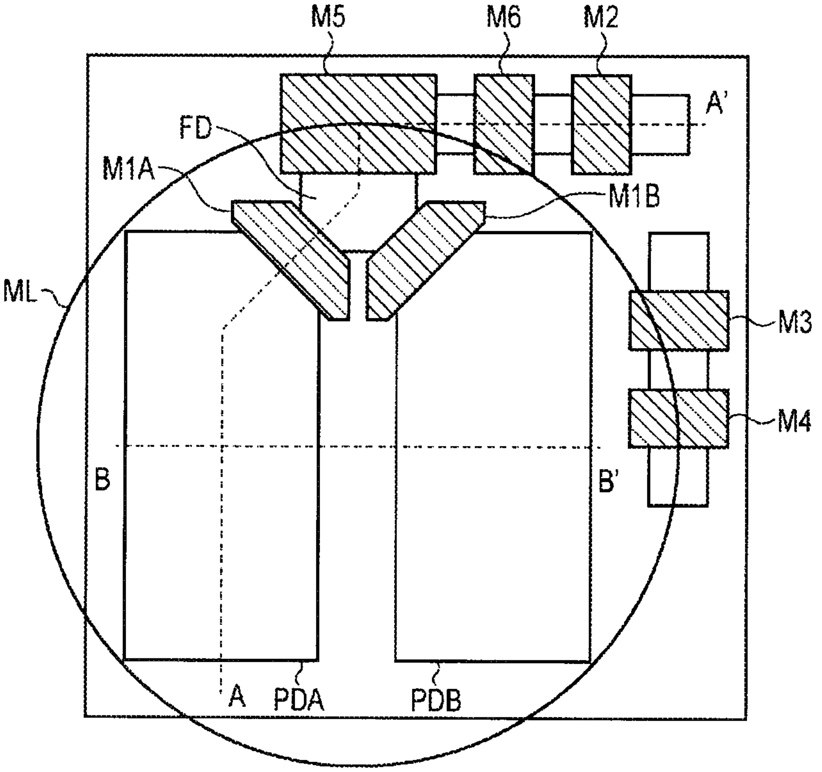
FIG. 3 is a schematic plan view illustrating a layout of the pixel according to the first embodiment.

FIG. 3 is a schematic plan view illustrating the layout of the pixel 11 according to the present embodiment. FIG. 3 schematically illustrates the arrangement of the photoelectric conversion elements PDA, PDB, the floating diffusion FD, respective transistors, and a microlens ML in a planar view. FIG. 3 illustrates gate electrodes and n-type impurity regions forming respective transistors, n-type impurity regions forming the photoelectric conversion elements PDA, PDB, and the microlens ML as a plan view. That is, in FIG. 3, the regions labeled with "PDA" and "PDB" indicate regions in which the n-type impurity regions of photodiodes forming the photoelectric conversion elements PDA, PDB are formed. In FIG. 3, the region labeled with "FD" indicates a region in which the n-type impurity region forming the floating diffusion FD is formed. In FIG. 3, the regions labeled with "M1A", "M1B", and "M2" to "M6" indicate regions in which the gate electrodes of corresponding transistors are arranged. The region labeled with "ML" indicates a position at which the microlens ML that guides incident light to the photoelectric conversion elements PDA, PDB is arranged.

The microlens ML is arranged at a position distant in the optical axis direction of the microlens ML from the photoelectric conversion elements PDA, PDB toward the subject side. The photoelectric conversion elements PDA, PDB are arranged in association with a single microlens ML. The photoelectric conversion elements PDA, PDB are arranged in divided left and right regions to which light is guided by the microlens ML.

Because of such arrangement, light entering the photoelectric conversion element PDA and light entering the photoelectric conversion element PDB enter the microlens ML at different incident angles from each other. The amount of incident light to the photoelectric conversion element PDA and the amount of incident light to the photoelectric conversion element PDB are substantially the same when the incident light is in focus. Therefore, focus detection can be performed by comparing a signal based on charges generated by the photoelectric conversion element PDA and a signal based on charges generated by the photoelectric conversion element PDB with each other.

A wiring (not illustrated) that transmits a control signal is connected to the gate electrode of each transistor. Further, the floating diffusion FD and the gate of the amplifier transistor M3 are connected by a wiring (not illustrated).

The line A-A' indicated in FIG. 3 indicates a position depicting the potential on a charge transfer path of the pixel 11 described later in the FIG. 5A to FIG. 5F and FIG. 6A to FIG. 6F. Further, the line B-B' indicated in FIG. 3 illustrates a position depicting the potential related to movement of charges between the photoelectric conversion elements PDA and PDB described later in FIG. 7A to FIG. 7C.

Figure 4A:
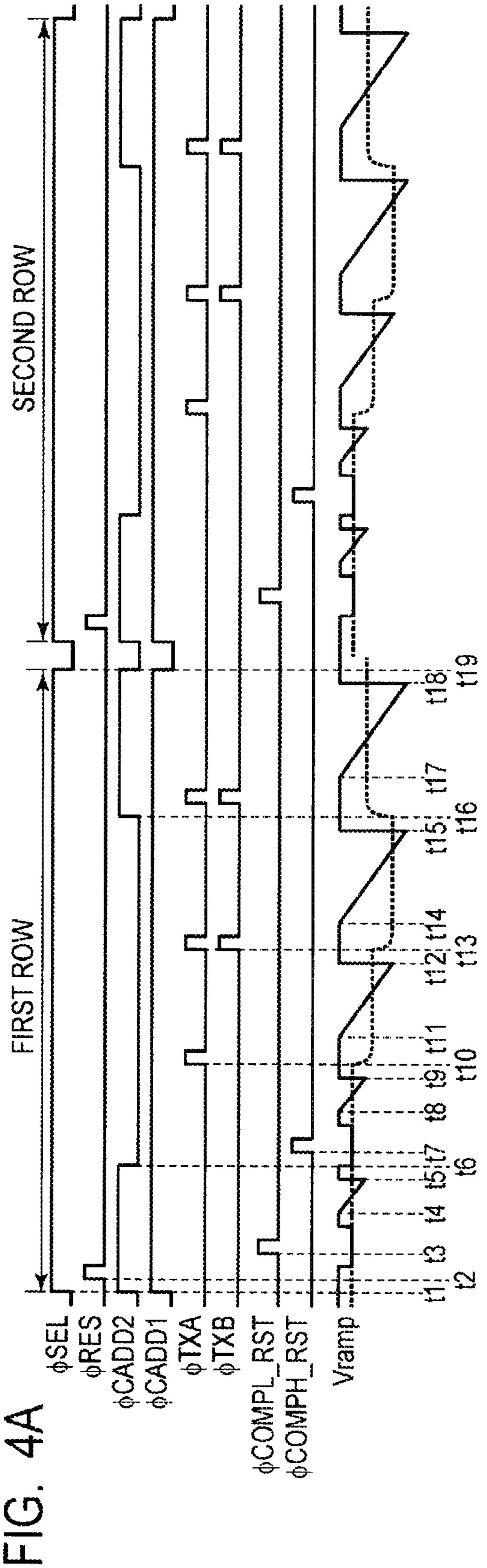
FIG. 4A and FIG. 4B are timing charts illustrating a drive method of the photoelectric conversion device according to the first embodiment.
Figure 4B:
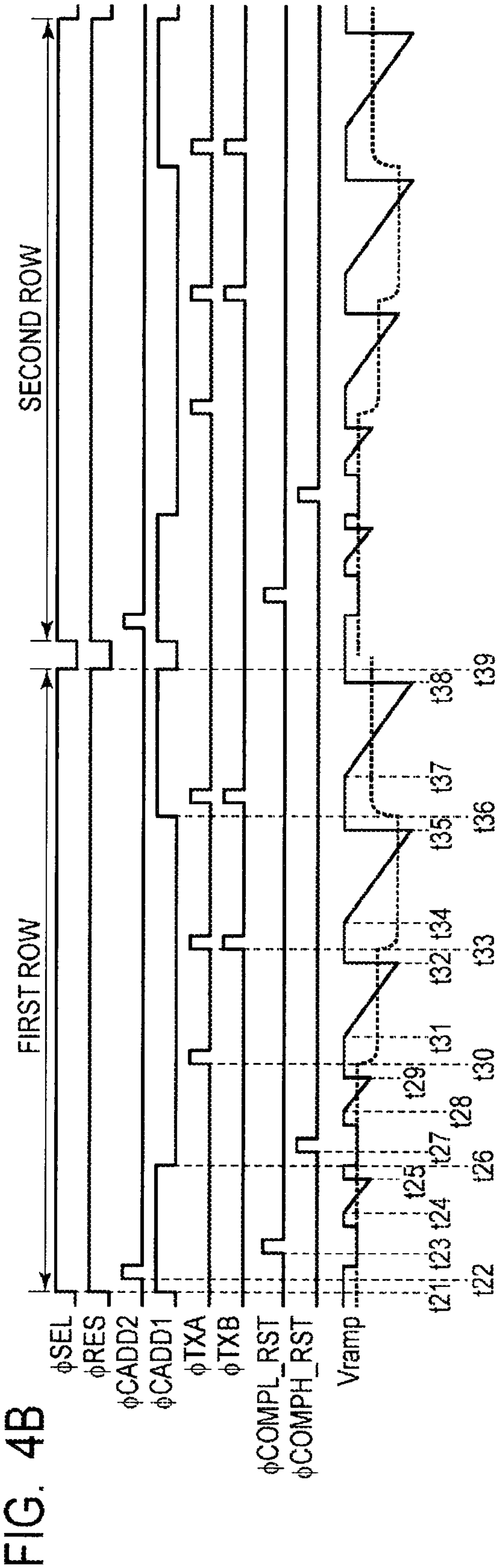

FIG. 4A and FIG. 4B are timing charts illustrating a drive method of a photoelectric conversion device according to the present embodiment. FIG. 4A and FIG. 4B illustrate drive methods of reading signals of the pixels 11 on the first row and the second row, and image acquisition for one frame is performed by repeating the same operation as above for the number of times corresponding to the number of rows to be read. Note that, although FIG. 4A and FIG. 4B illustrate the operations for the two rows of the first row and the second row, these operations only differ in the row from which a signal is read, and other features are the same. Thus, in the following, only the operation on the first row will be described unless otherwise noted. Further, in terms of spatial arrangement of the pixel array, the first row and the second row may be arranged adjacent to each other, or another pixel row may be arranged between the first row and the second row. For example, when some of the pixel rows are reduced, another pixel row may be arranged between the first row and the second row in terms of spatial arrangement of pixel rows. Further, a plurality of signal lines may be provided for a single column of pixels. In such a case, in terms of spatial arrangement of pixel rows, another pixel row may be arranged between the first row and the second row to be read to a single signal line. Such arrangement of the first row and the second row similarly applies to other embodiments. The photoelectric conversion device of the present embodiment can operate in two types of drive modes in accordance with illuminance of a subject, that is, the incident light amount. FIG. 4A illustrates a drive method in a high-illuminance drive mode (first mode) used when the incident light amount is relatively large, and FIG. 4B illustrates a drive method in a low-illuminance drive mode (second mode) used when the incident light amount is relatively small. These drive modes may be selected during image capturing by an external system such as an imaging system on which a photoelectric conversion device is mounted.

In FIG. 4A and FIG. 4B, "ϕSEL", "ϕRES", "ϕCADD1", "ϕCADD2", "ϕkTXA", and "ϕTXB" indicate control signals supplied to the pixel 11 on a corresponding row. In FIG. 4A and FIG. 4B, "ϕCOMPL_RST" and "ϕCOMPH_RST" schematically indicate reset timings of the comparator 31L and the comparator 31H, respectively.

As described above, when each control signal becomes a high level, the transistor to which this control signal is input is switched on, and when each control signal becomes a low level, the transistor to which this control signal is input is switched off. Further, the comparator 31L is reset at a timing that the control signal ϕCOMPL_RST transitions from a low level to a high level, and the comparator 31H is reset at a timing that the control signal ϕCOMPH_RST transitions from a low level to a high level.

Further, in FIG. 4A and FIG. 4B, the potential of the reference signal output from the reference signal generation circuit 23 is indicated by the solid line in the field of "Vramp". Furthermore, the potential of the output line 12 input to the comparators 31L, 31H is indicated by the dashed line in the field of "Vramp".

Next, specific drive methods of the high-illuminance drive mode and the low-illuminance drive mode will be described along time-series of the timing chart. First, the high-illuminance drive mode will be described with reference to FIG. 4A.

At time t1, the control signal ϕSEL becomes the high level. Accordingly, the selection transistor M4 on the first row is switched on, and a reading operation of a signal from the pixel 11 on the first row is started. Further, at time t1, the control signals ϕCADD1, ϕCADD2 become the high level, and the capacitance addition transistors M5, M6 are switched on. Accordingly, the capacitance at the node of the floating diffusion FD is in the state of "large". In the high-illuminance drive mode, the state of "large" having the largest capacitance is the low gain state.

At time t2, the control signal ϕRES becomes the high level, and the reset transistor M2 is switched on. Accordingly, the potential of the floating diffusion FD is reset, and a reset signal at the low gain is output to the output line 12. The level of the reference signal then changes to the resetting potential.

At time t3, the control signal ϕCOMPL_RST becomes the high level. Accordingly, the comparator 31L is reset. Specifically, in the comparator 31L configured as a switched capacitor amplifier, performed control is such that the input and the output of the amplifier are connected, and the potential difference between the reference signal and the output line 12 at cancellation of resetting becomes a logic threshold of the comparator 31L.

At time t4, the potential of the reference signal starts decreasing at a constant slope, and counting by the counter 24 starts. Accordingly, AD conversion on the reset signal at a low gain is started from time t4. In this AD conversion on the reset signal at the low gain, only the comparator 31L and the memory circuit 32L for the low gain are used, and the comparator 31H and the memory circuit 32H for the high gain are not used. In response to inversion of the relationship between the levels of the reference signal and the potential of the output line 12, the output of the comparator 31L changes. The count value in the counter 24 at the time that the output of the comparator 31L changes is held by the memory circuit 32L. At time t5, the AD conversion on the reset signal at the low gain ends.

At time t6, the control signal ϕCADD2 becomes the low level, and the capacitance addition transistor M6 is switched off. Accordingly, the capacitance at the node of the floating diffusion FD is in the state of "medium". In the high-illuminance drive mode, the state of a capacitance level of "medium" is the high gain state. Accordingly, the reset signal at the high gain is output to the output line 12.

At time t7, the control signal ϕCOMPH_RST becomes the high level. Accordingly, the comparator 31H is reset.

In the period from time t8 to time t9, AD conversion on the reset signal at the high gain is performed. In this AD conversion on the reset signal at the high gain, only the comparator 31H and the memory circuit 32H for the high gain are used, and the comparator 31L and the memory circuit 32L for the low gain are not used.

At time t10, the control signal ϕTXA becomes the high level, and the transfer transistor M1A is switched on. Accordingly, charges accumulated by photoelectric conversion in the photoelectric conversion element PDA are transferred to the floating diffusion FD. At this time, the focus detection signal is output to the output line 12. More specifically, charges transferred from the photoelectric conversion element PDA are subjected to charge-to-voltage conversion in accordance with the capacitance of the floating diffusion FD, and the potential of the output line 12 decreases. Since the pixel 11 is in the high gain state at the point of time t10, the reduction amount of the potential is larger than in a case where the pixel 11 is in the low gain state if the amount of transferred charges is the same.

In the period from time t11 to time t12, AD conversion on a focus detection signal at the high gain is performed. At this AD conversion, a digital signal of a result of the AD conversion on the focus detection signal is held in the memory circuit 32H independently of the digital signal of a result of the AD conversion on the reset signal.

At time t13, the control signals ϕTXA, ϕTXB become the high level, and the transfer transistors M1A, M1B are switched on. Accordingly, charges accumulated by photoelectric conversion in the photoelectric conversion elements PDA, PDB are transferred to the floating diffusion FD. In the floating diffusion FD, the charges transferred from the photoelectric conversion element PDA and the charges transferred from the photoelectric conversion element PDB are mixed, and a mixed signal at the high gain state is output to the output line 12.

In the period from time t14 to time t15, AD conversion on the mixed signal at the high gain is performed. At this AD conversion, a digital signal of a result of the AD conversion on the mixed signal is held in the memory circuit 32H independently of the digital signals of the results of the AD conversion on the reset signal and the focus detection signal.

At time t16, the control signal ϕCADD2 becomes the high level, and the capacitance addition transistor M6 is switched on. Accordingly, the capacitance at the node of the floating diffusion FD is in the state of "large", that is, the low gain state. Although described in detail later, some of the charges held in the floating diffusion FD before time t16 are distributed to the capacitance C2 after time t16. Accordingly, the change amount of the signal being output to the output line 12 decreases. The control signals ϕTXA, ϕTXB then become the high level, and the transfer transistors M1A, M1B are switched on. When charges remain in the photoelectric conversion elements PDA, PDB at the time of transfer of charges in the high gain state, the residual charges are transferred to the floating diffusion FD having the increased capacitance at this point of time.

In the period from time t17 to time t18, AD conversion on the mixed signal at the low gain is performed. At this AD conversion, a digital signal of a result of the AD conversion on the mixed signal is held in the memory circuit 32L independently of the digital signal of the result of the AD conversion on the reset signal.

At time t19, the control signals ϕSEL, ϕCADD1, ϕCADD2 become the low level, and the selection transistor M4 and the capacitance addition transistors M5, M6 are switched off. Accordingly, a reading period for the pixel 11 on the first row (first period) ends. A reading period for the second row (second period) then starts, however, since the operation thereof is substantially the same as that on the first row, the description thereof will be omitted. It can be considered that a single reading period is a period from a time of cancellation of resetting of the floating diffusion FD (time that the control signal ϕRES on the first row becomes the low level) to a time of the next resting (time that the control signal ϕRES on the second row becomes the high level).

The digital signals held in the memory circuits 32L, 32H are transferred to the signal processing circuit 27 as appropriate in accordance with the control of the horizontal scanning circuit 25. For example, the digital signal of the focus detection signal at the high gain is transferred within a period in which AD conversion on the mixed signal at the high gain is performed after time t12. Similarly, the digital signal of the mixed signal at the high gain is transferred within a period in which AD conversion on the mixed signal at low gain is performed. The digital signal of the mixed signal at the low gain is transferred within a period in which AD conversion on the reset signal on the second row is performed.

The digital signals of the focus detection signal and the mixed signal at the high gain are transferred to the signal processing circuit 27 together with the digital signal of the reset signal at the high gain and subjected to a subtraction process in the signal processing circuit 27. Accordingly, only the signal in accordance with the incident light amount is extracted. The digital signal after subjected to the subtraction is used for focus detection or generation of an image.

Similarly, a digital signal of the mixed signal at the low gain is transferred to the signal processing circuit 27 together with the digital signal of the reset signal at the low gain and subjected to a subtraction process in the signal processing circuit 27.

Next, the low-illuminance drive mode will be described with reference to FIG. 4B. In this section, features different from those of the high-illuminance drive mode will be mainly described, and description of the same operation as that of the high-illuminance drive mode will be omitted or simplified.

As illustrated in FIG. 4B, the operations of the control signals ϕRES, ϕCADD1, ϕCADD2 in the low-illuminance drive mode differ from those in the high-illuminance drive mode. Accordingly, in the low-illuminance drive mode, the capacitance of the floating diffusion FD during reading operations of respective signals differs from that of the high-illuminance drive mode. Other control signals and the reference signal are common between the low-illuminance drive mode and the high-illuminance drive mode.

The control signal ϕRES is maintained at the high level during the period from time t21 to time t39, that is, a reading period for the pixel 11 on the first row. Therefore, the reset transistor M2 is maintained in the on-state during the period.

In the low-illuminance drive mode, resetting is controlled mainly by the control signal ϕCADD2. The control signal ϕCADD2 becomes the high level at time t22. Time t22 corresponds to time t2 in FIG. 4A. Since all the reset transistor M2 and the capacitance addition transistors M5, M6 are switched on at time t22, time t22 is a timing that the potential of the floating diffusion FD is reset. The control signal ϕCADD2 is maintained at the low level during other periods than this reset period.

On the other hand, the capacitance of the floating diffusion FD is controlled mainly by the control signal ϕCADD1. The control signal ϕCADD1 becomes the high level during the period from time t21 to time t26 and the period time t36 to time t39, and the capacitance addition transistor M5 is in the on-state during these periods. These periods correspond to the period from time t1 to time t6 and the period from time t16 to time t19 in FIG. 4A, that is, correspond to the period at the low gain. That is, in the low-illuminance drive mode, the state of a capacitance of "medium" is the low gain state, and the state of the smallest capacitance of "small" is the high gain state.

The saturated charge amount of the floating diffusion FD depends on the level of the capacitance. The saturation charge amount of the floating diffusion FD in the low-illuminance drive mode is less than that in the high-illuminance drive mode. Since the low-illuminance drive mode is a mode used when the incident light amount is small, however, a problem due to a saturated charge amount is less likely to occur. Further, since the capacitance of the floating diffusion FD at the high gain is in the smallest state, the potential change amount can be increased even when charges caused by incident light is less. Thus, with the use of the low-illuminance drive mode, noise due to a reading circuit downstream of the pixel 11 can be relatively smaller than in the case of the high-illuminance drive mode.

FIG. 5A to FIG. 5F and FIG. 6A to FIG. 6F are schematic diagrams illustrating potentials of the pixel 11 according to the present embodiment. FIG. 5A to FIG. 5F illustrate the potential in a case of the high-illuminance drive mode, and FIG. 6A to FIG. 6F illustrate the potential in a case of the low-illuminance drive mode.

FIG. 5A to FIG. 5F and FIG. 6A to FIG. 6F schematically illustrate the potential at the position taken along the line A-A' in FIG. 3. In these drawings, "PDA" indicates the position of the photoelectric conversion element PDA. Further, "M1A", "FD", "M5", "M6", and "M2" indicate the positions of the transfer transistor M1A, the floating diffusion FD, the capacitance addition transistor M5, the capacitance addition transistor M6, and the reset transistor M2, respectively. Further, "C1" indicates the position of the n-type diffusion layer on the side of the drain forming the capacitance addition transistor M5, and "C2" indicates the position of the n-type diffusion layer on the side of the drain forming the capacitance addition transistor M6.

First, transition of the state in the high-illuminance drive mode will be described with reference to FIG. 5A to FIG. 5F.

Figure 5A:
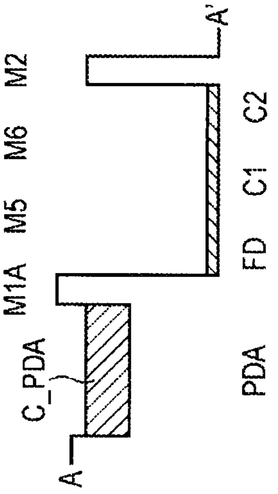
FIG. 5A, FIG. 5B, FIG. 5C, FIG. 5D, FIG. 5E and FIG. 5F are schematic diagrams illustrating potentials of the pixel according to the first embodiment.

FIG. 5A corresponds to the period from time t4 to time t5 in FIG. 4A. That is, FIG. 5A illustrates the potential in a period during which AD conversion on the reset signal at the low gain is performed. Since this period occurs before charge transfer is performed, the charge C_PDA has been accumulated in the photoelectric conversion element PDA.

Both the capacitance addition transistors M5, M6 are in the on-state, and noise charges at the point of time that the reset transistor M2 is switched off are held in the floating diffusion FD to which the capacitors C1, C2 are connected. In this state, AD conversion on the reset signal at the low gain is performed. Herein, the potential when the reset transistor M2 is in the off-state is controlled to be higher than the potential when the capacitance addition transistor M6 is in the off-state. Specifically, a voltage at the off-state applied to the gate of the capacitance addition transistor M6 is set higher than a voltage at the off-state applied to the gate of the reset transistor M2.

Figure 5B:
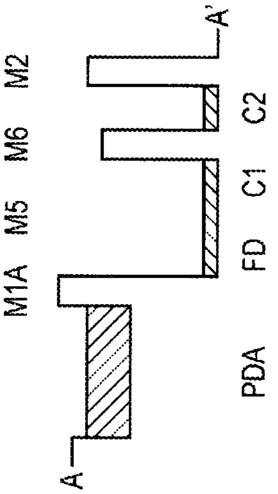

FIG. 5B corresponds to the period from time t8 to time t9 in FIG. 4A. That is, FIG. 5B illustrates the potential in a period during which AD conversion on the reset signal at the high gain is performed. When the capacitance addition transistor M6 is switched off at time t6, noise charges are distributed to the side of the floating diffusion FD and the capacitor C1 and the side of the capacitor C2. The AD conversion on the reset signal at the high gain in the period from time t8 to time t9 is performed in this state.

Figure 5C:
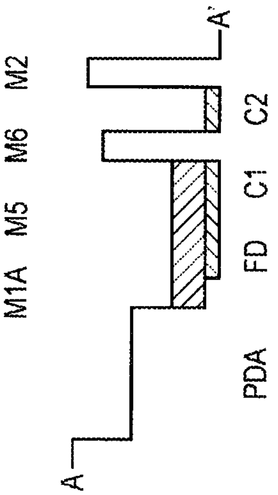

FIG. 5C corresponds to the time immediately after time t10 in FIG. 4A. That is, FIG. 5C illustrates the potential of on-going transfer of the charge C_PDA. At this time, the transfer transistor M1A is switched on, the charges C_PDA accumulated in the photoelectric conversion element PDA are transferred to the floating diffusion FD. In the present embodiment, since the charge amount Qfd+Qc1 that can be held by the floating diffusion FD and the capacitor C1 is sufficiently larger than the saturated charge amount Qa_sat at which the photoelectric conversion element PDA is saturated, charges do not overflow after the transfer.

Figure 5D:
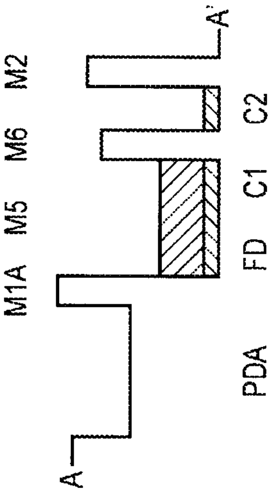

FIG. 5D corresponds to the period from time t11 to time t12 in FIG. 4A. That is, FIG. 5D illustrates the potential in a period during which AD conversion on the focus detection signal at the high gain is performed. After the charge C_PDA is transferred to the node of the floating diffusion FD and the capacitor C1, the transfer transistor M1A is switched off. Other features are the same as those during the reading operation of the reset signal at the high gain. The AD conversion on the focus detection signal at the high gain in the period from time t11 to time t12 is performed in this state. As described above, the digital signal of the reset signal at the high gain is subtracted from the digital signal of the focus detection signal at the high gain, and thereby a signal in accordance with the charges C_PDA transferred from the photoelectric conversion element PDA is extracted.

Figure 5E:
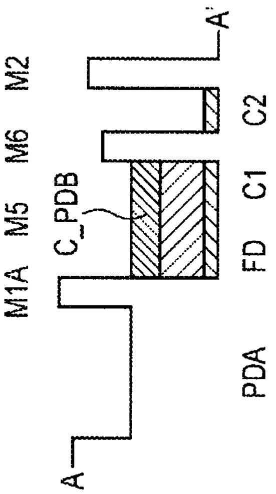

FIG. 5E corresponds to the period from time t14 to time t15 in FIG. 4A. That is, FIG. 5E illustrates the potential in a period during which AD conversion on the mixed signal at the high gain is performed. At time t13, the charges C_PDB are transferred from the photoelectric conversion element PDB in the same manner as the charge transfer from the photoelectric conversion element PDA. Accordingly, the floating diffusion FD and the capacitor C1 are in a state where the charges C_PDA generated by the photoelectric conversion element PDA and the charges C_PDB generated by the photoelectric conversion element PDB are mixed. The AD conversion on the mixed signal at the high gain in the period from time t14 to time t15 is performed in this state. The digital signal of the reset signal at the high gain is subtracted from the digital signal of the mixed signal at the high gain, and thereby a signal in accordance with the sum of the charge C_PDA transferred from the photoelectric conversion element PDA and the charge C_PDB transferred from the photoelectric conversion element PDB is extracted.

Note that, when the amount of charges accumulated in the photoelectric conversion element PDA and the photoelectric conversion element PDB is significantly large, there may be a case where some transferred charges are not held by the floating diffusion FD and the capacitor C1. In such a case, charges may remain in the photoelectric conversion element PDA and the photoelectric conversion element PDB. Further, charges of the capacitor C1 may exceed the potential in the off-state of the capacitance addition transistor M6 and overflow to the capacitor C2. In such a case, the mixed signal at the high gain is saturated, a correct signal is not obtained. However, by reading the mixed signal at the low gain described later, it is possible to avoid saturation and read a signal.

Figure 5F:
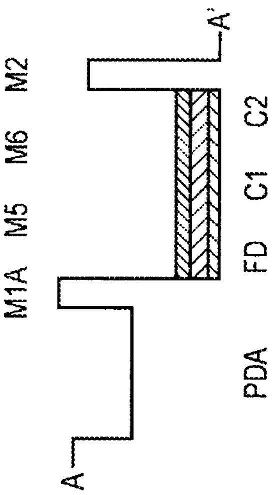
Figure 6A:
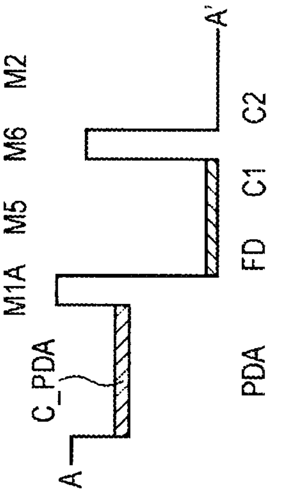
FIG. 6A, FIG. 6B, FIG. 6C, FIG. 6D, FIG. 6E and FIG. 6F are schematic diagrams illustrating potentials of the pixel according to the first embodiment.
Figure 6B:
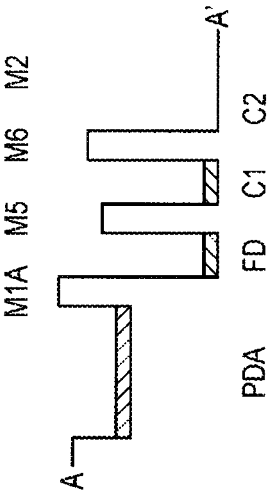
Figure 6C:
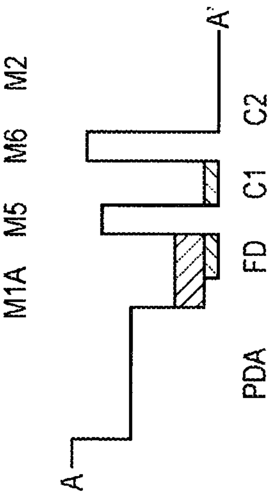
Figure 6D:
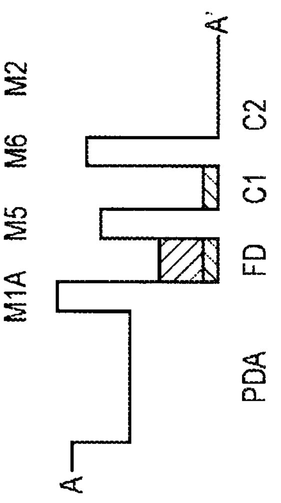
Figure 6E:
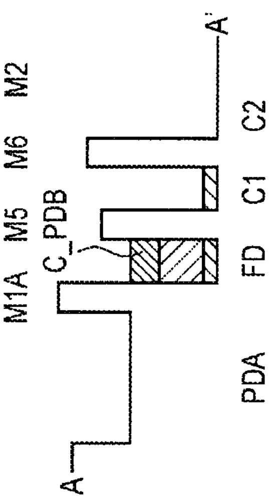
Figure 6F:
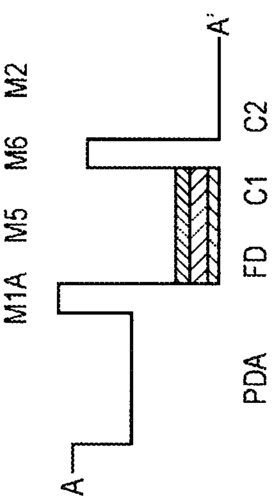

FIG. 5F corresponds to the period from time t17 to time t18 in FIG. 4A. That is, FIG. 5F illustrates the potential in a period during which AD conversion on the mixed signal at the low gain is performed. Since the capacitance addition transistor M6 is in the on-state at time t16, during AD conversion on the mixed signal at the low gain, the capacitors C1, C2 are connected to the floating diffusion FD to form the state of a large capacitance. Accordingly, when the transferred charge amount is the same, the potential reduction amount is smaller at the low gain than at the high gain.

Also when charges remain in the photoelectric conversion element PDA and the photoelectric conversion element PDB due to transfer before AD conversion at the high gain, residual charges are transferred to the floating diffusion FD before AD conversion on the mixed signal at the low gain. At this transfer, since the capacitance added to the floating diffusion FD is increased, residual charges are less likely to occur. Further, also when some of the charges overflow to the capacitor C2 at the high gain, since the potential of the off-state of the reset transistor M2 is higher than the potential in the off-state of the capacitance addition transistor M6, the overflowing charges are held in the capacitor C2. The capacitance addition transistor M6 is switched on before AD conversion on the mixed signal at the low gain, thereby the capacitor is added, and the charges held in the capacitor C2 are again mixed. Thus, the mixed signal including the overflowing charges can be obtained.

Next, the transition of the state in the low-illuminance drive mode will be described with reference to FIG. 6A to FIG. 6F focusing on differences from FIG. 5A to FIG. 5F. Six states illustrated in FIG. 6A to FIG. 6F correspond to the six states illustrated in FIG. 5A to FIG. 5F, respectively.

In the low-illuminance drive mode, a state where the capacitor C1 is connected to the floating diffusion FD is the low gain state, and a state where none of capacitors is connected to the floating diffusion FD is the high gain state. Thus, as stated in the description of FIG. 4A and FIG. 4B, the operations of the capacitance addition transistors M5, M6 and the reset transistor M2 differ from those in the high-illuminance drive mode. Further, the potential in the off-state of the capacitance addition transistor M6 is controlled to be higher than the potential in the off-state of the capacitance addition transistor M5. Since other operations are substantially the same as the high-illuminance drive mode, the description thereof will be omitted.

Figure 7A:
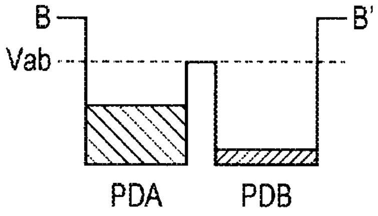
FIG. 7A, FIG. 7B and FIG. 7C are schematic diagrams illustrating potentials of photoelectric conversion elements according to the first embodiment.
Figure 7B:
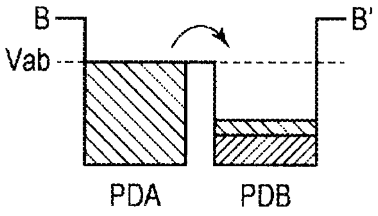
Figure 7C:
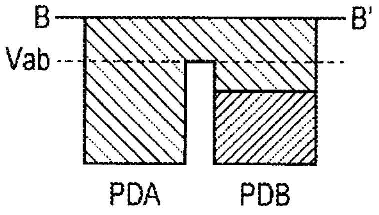

FIG. 7A to FIG. 7C are schematic diagrams illustrating the potentials of the photoelectric conversion elements PDA, PDB according to the present embodiment. FIG. 7A to FIG. 7C schematically illustrate the potential at the position taken along the line B-B' in FIG. 3. In these drawings, "PDA" and "PDB" indicate the positions of the photoelectric conversion element PDA and the photoelectric conversion element PDB, respectively. FIG. 7A to FIG. 7C depict three states where the incident light amounts differ from each other. Further, FIG. 7A to FIG. 7C illustrate an example of a case where more light enters the photoelectric conversion element PDA than the photoelectric conversion element PDB as an example.

Further, "Vab" in FIG. 7A to FIG. 7C indicates the potential between the photoelectric conversion element PDA and the photoelectric conversion element PDB (hereafter, referred to as inter-AB isolation). The potential Vab is lower than the potential in an element isolation region that isolates the region of the photoelectric conversion element PDA and the photoelectric conversion element PDB from the region outside thereof.

FIG. 7A illustrates the state where neither the photoelectric conversion element PDA nor the photoelectric conversion element PDB is saturated. As illustrated in FIG. 7A, since both the potentials of charges accumulated in the photoelectric conversion elements PDA, PDB are lower than the potential Vab of the inter-AB isolation, the charges do not move beyond the inter-AB isolation. The saturated charge amount that can be accumulated by the photoelectric conversion element PDA without exceeding the inter-AB isolation potential Vab is denoted as Qa_sat.

FIG. 7B illustrates a state where the photoelectric conversion element PDA is saturated but the photoelectric conversion element PDB is not saturated. As illustrated in FIG. 7B, charges generated by photoelectric conversion in the photoelectric conversion element PDA exceed the potential Vab of the inter-AB isolation and are held in the photoelectric conversion element PDB. Thus, in the state of FIG. 7B, even with incidence of light, charges held in the photoelectric conversion element PDA do not increase. When charges are further accumulated in the photoelectric conversion element PDB from the state of FIG. 7B and once the same potential as the potential Vab of the inter-AB isolation is reached, charges then start being accumulated more in both the photoelectric conversion element PDA and the photoelectric conversion element PDB in accordance with incidence of light.

FIG. 7C is a state where charges are accumulated up to the potential of the element isolation outside the photoelectric conversion element PDA and the photoelectric conversion element PDB. Once charges further increase from this state in response to photoelectric conversion, charges exceed the potential of the element isolation and move to the transistor in the floating diffusion FD and the n-type diffusion layers of transistors in the pixel 11. Thus, accumulated charges in the photoelectric conversion element PDA and the photoelectric conversion element PDB do not increase, and the photoelectric conversion element PDA and the photoelectric conversion element PDB are in a saturated state. In the charge accumulating period in the photoelectric conversion element PDA and the photoelectric conversion element PDB, since the floating diffusion FD is controlled to be in the reset state, the overflowing charges are discharged to the power source. As set forth, the saturated charge amount that can be accumulated in the photoelectric conversion element PDA and the photoelectric conversion element PDB is denoted as Qab_sat.

Figure 8A:
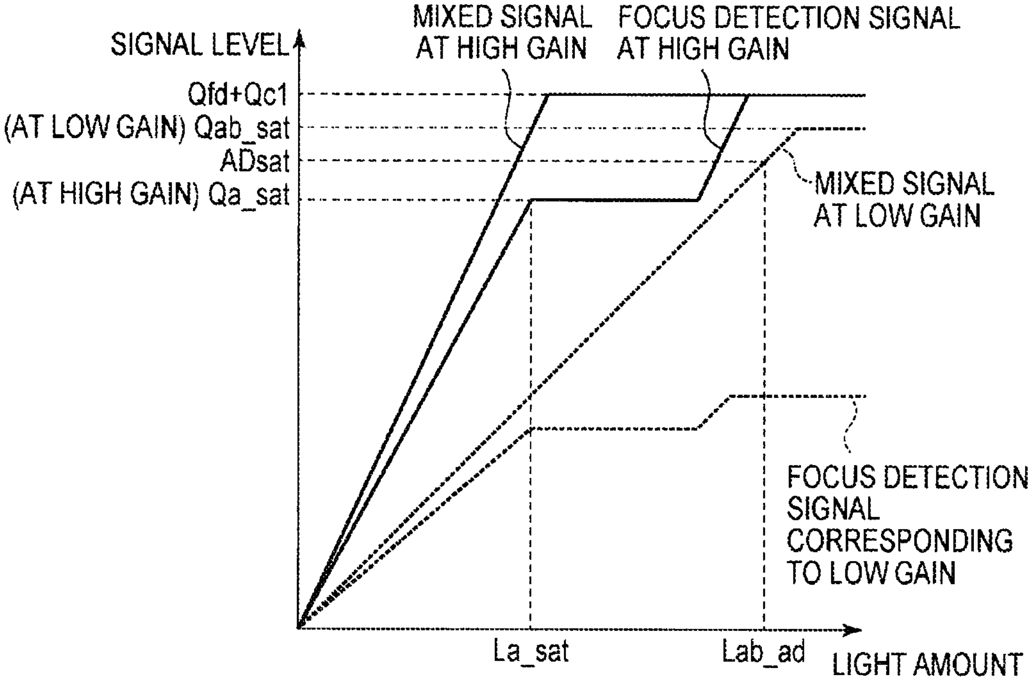
FIG. 8A and FIG. 8B are graphs illustrating a relationship between a light amount and a signal level according to the first embodiment.
Figure 8B:
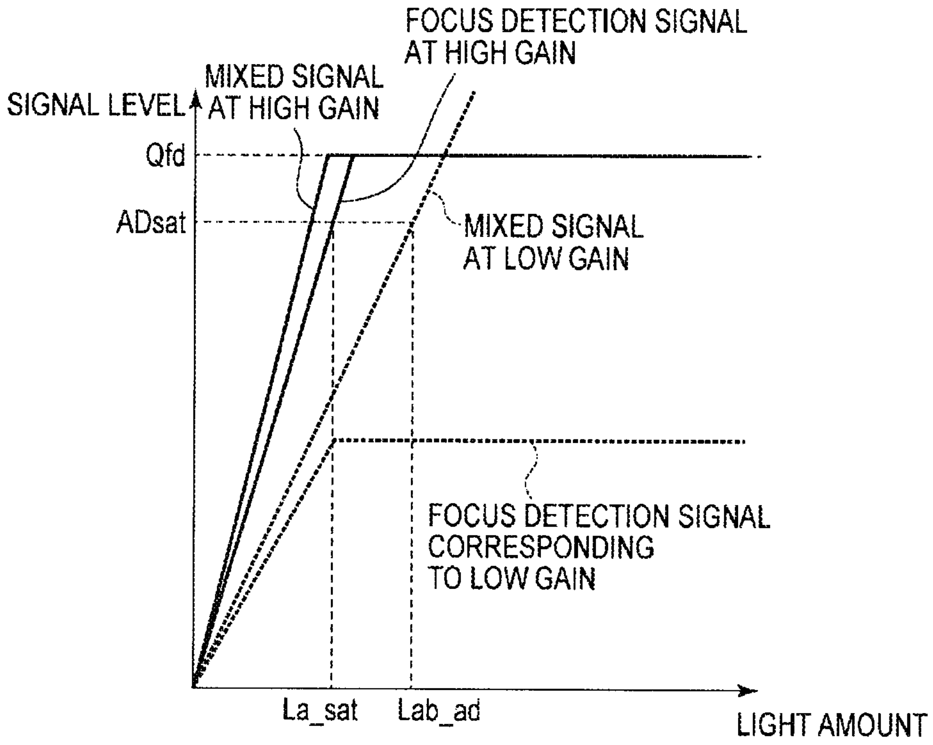

FIG. 8A and FIG. 8B are graphs illustrating the relationship between the light amount and the signal level according to the present embodiment. FIG. 8A illustrates the relationship between the light amount and the signal level in a case of the high-illuminance drive mode, and FIG. 8B illustrates the relationship between the light amount and the signal level in a case of the low-illuminance drive mode. In FIG. 8A and FIG. 8B, the horizontal axis represents the light amount of incident light, and the vertical axis represents the signal level relative to the reset signal as a reference (potential change amount due to charge transfer). Further, in FIG. 8A and FIG. 8B, the solid lines represent the relationship between the light amount and the signal level for a focus detection signal and a mixed signal at the high gain, and the dashed lines represent the relationship between the light amount and the signal level for a focus detection signal and a mixed signal at the low gain. As described above, although being read only at the high gain, the focus detection signal is converted into a value corresponding to the low gain and illustrated in FIG. 8A and FIG. 8B.

Note that, in terms of easier understanding of the behavior after the photoelectric conversion element PDA is saturated, FIG. 8A and FIG. 8B illustrate a case where the majority of light entering the pixel 11 enters the photoelectric conversion element PDA side as an example. Further, for the signal level on the vertical axis of FIG. 8A and FIG. 8B, the saturated charge amount corresponding to the signal level may be denoted as a label.

First, the relationship between the light amount and the signal level in the high-illuminance drive mode will be described with reference to FIG. 8A. The signal level of a mixed signal at the low gain increases linearly with the light amount and is saturated at a level corresponding to Qab_sat. The AD conversion element 30 performs AD conversion with the upper limit being a level smaller than the signal level corresponding to Qab_sat. Herein, the signal level corresponding to the saturation level in AD conversion is denoted as ADsat. Further, the maximum light amount of the mixed signal such that the signal level resulted after subjected to AD conversion is ADsat is denoted as Lab_ad.

On the other hand, the mixed signal at the high gain when the capacitance of the floating diffusion FD is small is saturated at a signal level corresponding to Qfd+Qc1 before reaching Qab_sat.

In such a way, in the mixed signal, the linearity can be maintained up to the light amount of Lab_ad at the low gain, and a signal with relatively low noise at the high gain can be acquired within a small range of the light amount. Accordingly, the dynamic range can be expanded.

In contrast, the focus detection signal at the high gain is saturated at a signal level corresponding to the saturated charge amount Qa_sat that can be accumulated in the photoelectric conversion element PDA. At this time, the maximum light amount that can be used for focus detection as a linear signal is denoted as La_sat. The range of the light amount that can be used for focus detection is narrower than that of the light amount that can be used for image generation as a mixed signal.

If Qfd+Qc1 is significantly small, the reduction amount of the potential due to charge transfer will be large, and a signal may thus be out of the range of AD conversion at a light amount lower than the amount at which charges accumulated in the photoelectric conversion element PDA reach Qa_sat and cause saturation. In such a case, the upper limit of the light amount that can be used for focus detection is significantly reduced. In contrast, in the photoelectric conversion device of the present embodiment, the charge amount Qfd+Qc1 that can be accumulated in the floating diffusion FD at the high gain is sufficiently larger than Qa_sat. Therefore, AD conversion does not cause saturation, and linear output can be obtained until the light amount corresponding to Qa_sat is reached.

More specifically, it is desirable that the capacitance ratio corresponding to the gain ratio of the high gain to the low gain, namely, (Cfd+C1+C2)/(Cfd+C1) be smaller than the ratio of two types of saturated charge amounts in the photoelectric conversion elements PDA, PDB, namely, Qab_sat/Qa_sat. The upper limit of the AD conversion is set to a value close to the saturated charge amount Qab_sat. If the capacitance ratio is larger than the ratio of saturated charge amounts described above, the upper limit of the AD conversion on the focus detection signal is smaller than in a case of saturation due to Q_sat, and the light amount range of the focus detection signal is undesirably limited. It is thus desirable that the capacitance ratio be smaller than the ratio of saturated charge amounts, as described above. Note that, in terms of expanding the gain switching range, it is desirable that the capacitance ratio be increased as much as possible within a range not exceeding the ratio of the saturated charge amount described above.

Note that the range of a signal level on which AD conversion is performed may be set by an external system such as an imaging system based on the incident light amount. Thus, an expanded range of the light amount that enables focus detection may improve the accuracy when a bright subject is in focus. Further, by increasing the capacitance ratio as much as possible within the range not exceeding the ratio of saturated charge amounts described above, it is possible to achieve both the effect of expansion of the dynamic range and the improvement of accuracy in focus detection in high gain reading.

Further, the limitation to the range that enables focus detection due to the cause described above is more notable when the majority of light entering the pixel 11 enters the photoelectric conversion element PDA as with the example of FIG. 8A. For example, when the majority of light enters the photoelectric conversion element PDB, the focus detection signal based on the photoelectric conversion element PDA is read without saturation.

Note that the focus detection signal in accordance with the incident light amount of the photoelectric conversion element PDB can be calculated by subtracting the focus detection signal of the photoelectric conversion element PDA converted into a signal corresponding to the low gain from the mixed signal at the low gain. Therefore, the focus detection signal in accordance with the incident light amount of the photoelectric conversion element PDB is not subjected to the limitation to the range that enables focus detection due to the cause described above, and the light amount at which the mixed signal is saturated is the upper limit.

As described above, by setting the capacitance ratio, which is a gain ratio of the low gain and the high gain, within the range described above, it is possible to expand the light amount range in which the focus detection signal can be suitably acquired in various situations of incident light.

Next, the relationship between the light amount and the signal level in the low-illuminance drive mode will be described with reference to FIG. 8B. The low-illuminance drive mode is set by an external system such as an imaging system when the amount of light entering the photoelectric conversion device is not large. In the low-illuminance drive mode, AD conversion is performed in smaller range of the light amount than in the high-illuminance drive mode.

In the low-illuminance drive mode, the capacitance of the floating diffusion FD at the high gain is Cfd, and this corresponds to a state where the gain is relatively higher than in the high gain of the high-illuminance drive mode. Thus, the maximum light amount La_sat of the focus detection signal is defined in accordance with the signal level of the upper limit in AD conversion rather than saturation due to the signal level reaching Qa_sat. That is, in the situation where the majority of light entering the pixel 11 enters the photoelectric conversion element PDA, the saturated light amount ratio of the mixed signal and the focus detection signal Lab_ad/La_sat substantially matches the capacitance ratio (Cfd+C1)/Cfd that is the gain ratio of the low gain and the high gain. Also in such a situation, it is desirable that the capacitance ratio (Cfd+C1)/Cfd be smaller than Qab_sat/Qa_sat in the same manner as in the high-illuminance drive mode so that the upper limit light amount of the focus detection signal is not smaller than the upper limit light amount due to AD conversion on the mixed signal. Further, it is desirable that the capacitance ratio be increased as much as possible within the range not exceeding the ratio of saturated charge amounts described above in the same manner as in the high-illuminance drive mode.

As described above, according to the present embodiment, a photoelectric conversion device that has a pixel capable of outputting a signal used for focus detection and may more suitably expand the dynamic range is provided.

Note that, although the configuration that can change the gain to three levels by adding one or two capacitances to the floating diffusion FD is illustrated as an example in the present embodiment, the configuration is not limited thereto. The advantageous effect of the present embodiment can be obtained as long as the gain can be changed to at least two levels.

Further, in the present embodiment, in the high-illuminance drive mode, the state where the capacitance level is "medium" corresponds to the high gain and the state where the capacitance level is "large" corresponds to the low gain. In the high-illuminance drive mode, however, the state where the capacitance level is "small" may correspond to the high gain and the state where the capacitance level is "large" may correspond to the low gain. In this configuration, although the light amount range of the focus detection signal is narrower, the capacitance ratio in the floating diffusion FD is further increased, and the effect of expansion of the dynamic range may be improved.

Further, although the capacitance addition transistors M5, M6 are arranged to be connected in series to the reset transistor M2 in the present embodiment, the arrangement of the capacitance addition transistors M5, M6 is not limited thereto. For example, at least one of the capacitance addition transistors M5, M6 may be arranged to be connected in parallel to the reset transistor M2. That is, the circuit configuration of the pixel 11 may be suitably modified as long as it is configured to be able to change the capacitance of the floating diffusion FD.

Note that, although the example of the reading method of reading signals on a row basis from the plurality of pixels 11 has been described with reference to FIG. 4A, FIG. 4B, and the like in the present embodiment, the method is not limited to this form. For example, signals may be read to a single signal line in parallel from the pixels 11 arranged on a plurality of rows (two or more rows). By performing such an operation, it is possible to mix signals on a signal line that are output from the pixels 11 on a plurality of rows.

Second Embodiment

A photoelectric conversion device according to a second embodiment will be described with reference to FIG. 9 and FIG. 10. The photoelectric conversion device of the second embodiment further has a gain change unit or circuit that can change the gain. Further, the photoelectric conversion device of the second embodiment has a function of reducing the gain of the gain change circuit and thereby expanding the light amount range in which the focus detection signal is not saturated when reading a focus detection signal at the high gain in the low-illuminance drive mode. The low-illuminance drive mode of the present embodiment may also be referred to as a second low-illuminance drive mode. In the following, differences of the present embodiment from the first embodiment will be mainly described.

Figure 9:
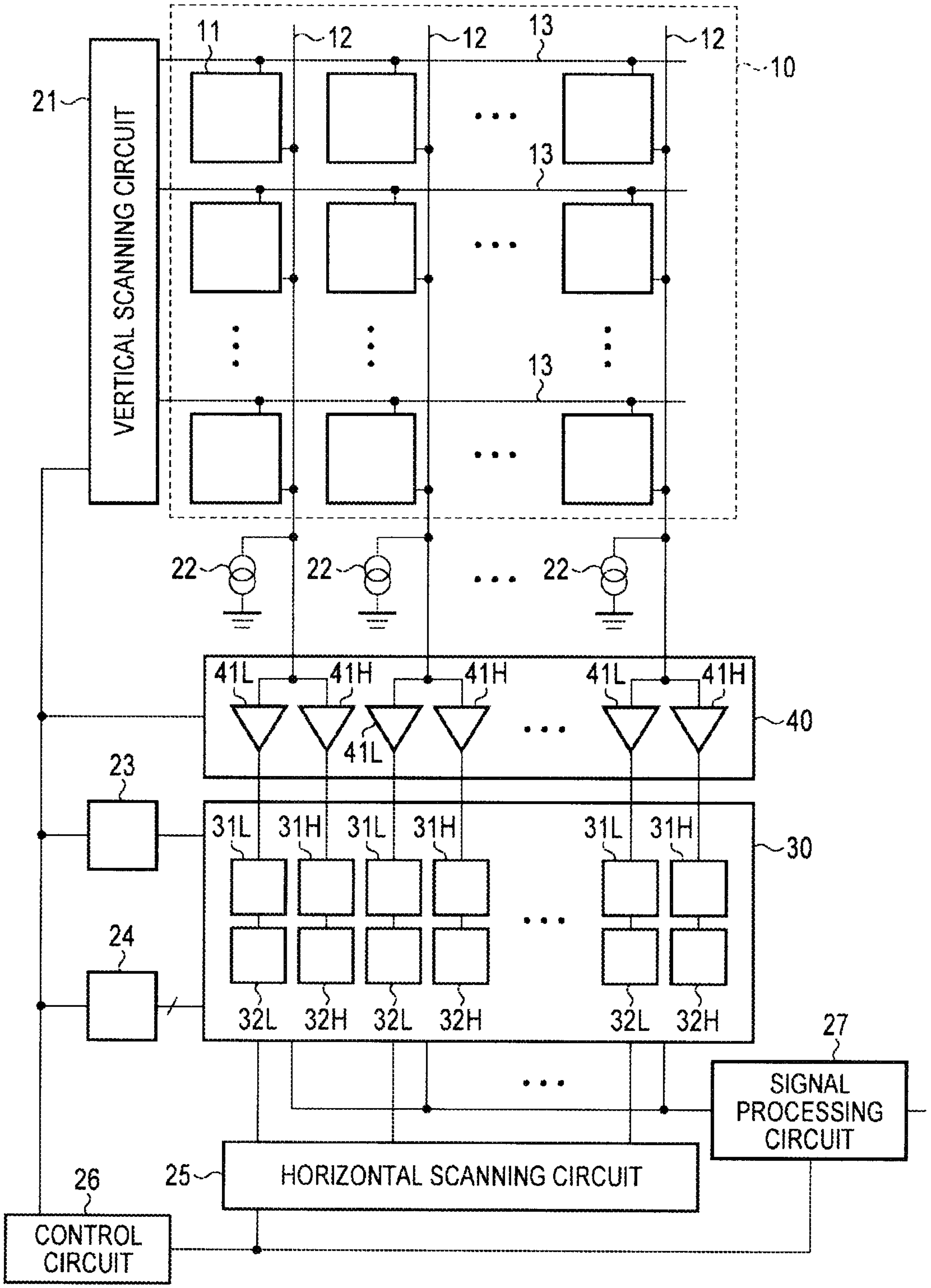
FIG. 9 is a block diagram illustrating a general configuration of a photoelectric conversion device according to a second embodiment.

FIG. 9 is a block diagram illustrating the general configuration of the photoelectric conversion device according to the present embodiment. The photoelectric conversion device of the present embodiment further has a gain change unit or circuit 40 for the photoelectric conversion device of the first embodiment. The gain change circuit 40 has two gain change circuits 41L, 41H on a column basis. The output line 12 is connected to the input terminals of the gain change circuits 41L, 41H on the corresponding column. The output terminals of the gain change circuits 41L, 41H are connected to the input terminals of the comparators 31L, 31H, respectively. Each of the gain change circuits 41L, 41H is formed of a switched capacitor amplifier, for example, and the potentials of the input focus detection signal and mixed signal are amplified or attenuated by variable gains. Further, each of the gain change circuits 41L, 41H can change the gain in accordance with the drive mode. The gain change circuit 41L is used in a reading operation at the low gain, the gain change circuit 41H is used in a reading operation at the high gain.

In the present embodiment, the gain change circuits 41L, 41H are controlled to have the same gain in the high-illuminance drive mode. On the other hand, in the second low-illuminance drive mode, control is performed so that the gain of the gain change circuit 41H is smaller than the gain of the gain change circuit 41L. That is, the gain change circuit 41H performs an operation so that the gain of a signal amplified at the gain in the pixel 11 and output to the output line 12 is relatively reduced. Accordingly, a signal from a larger light amount than at the high gain can be included in the range of AD conversion performed by the AD conversion circuit 30 to expand the light amount range of the focus detection signal.

Figure 10:
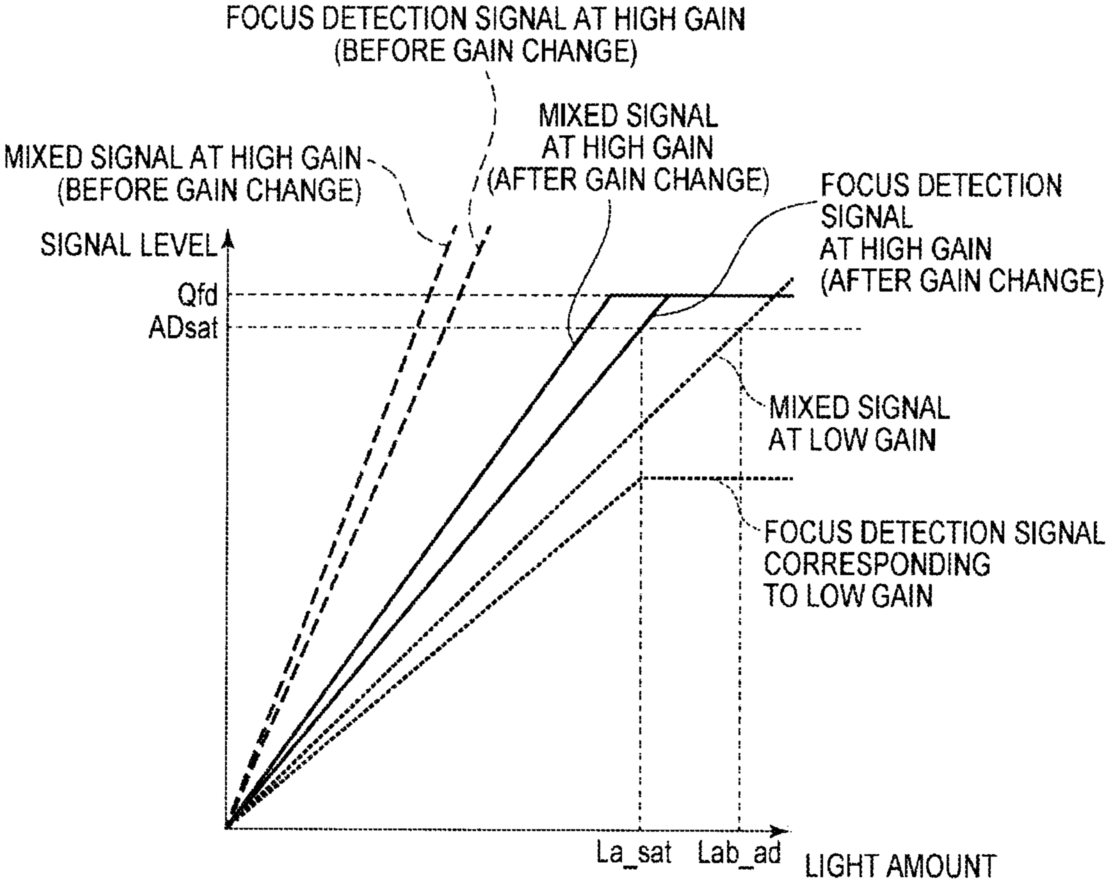
FIG. 10 is a graph illustrating a relationship between a light amount and a signal level according to the second embodiment.

FIG. 10 is a graph illustrating the relationship between the light amount and the signal level according to the present embodiment. FIG. 10 illustrates the relationship between the light amount and the signal level in the case of the second low-illuminance drive mode. FIG. 10 illustrates the relationships between the light amount and the signal level at the high gain for a case where the gain is not changed by the gain change circuit 41H (before a gain change) and a case where the gain has been changed by the gain change circuit 41H (after a gain change), respectively.

In the second low-illuminance drive mode, a situation where an incident light amount is smaller than the charge amount that can be accumulated in the floating diffusion FD is expected. Therefore, an AD conversion range at the low gain corresponding to the expected potential change amount has been set. Thus, the signal level reaches the maximum signal level ADsat of the AD conversion range at an incident light amount smaller than at signal saturation due to the signal level reaching Qfd before a gain change performed by the gain change circuit 41H at the high gain. Accordingly, by attenuating the signal by the gain change circuit 41H to the extent that Qfd is not below ADsat, it is possible to maintain the linearity and contain a large amount of light within the AD conversion region.

At this time, because the gain change circuit 41H attenuates the signal, circuit noise in the circuits downstream of the gain change circuit 40 may be relatively large. However, the effect of expansion of the dynamic range achieved by switching the capacitance of the floating diffusion FD is obtained in the same manner as in the first embodiment. In addition, in the present embodiment that enables the operation in the second low-illuminance drive mode, it is possible to configure the capacitance ratio (Cfd+C1)/Cfd to be larger than in the first embodiment. Accordingly, it is possible to further improve the effect of expansion of the dynamic range while widening the light amount range in which a focus detection signal can be suitably acquired in the second low-illuminance drive mode.

In the present embodiment, a photoelectric conversion device that has a pixel capable of outputting a signal used for focus detection and may more suitably expand the dynamic range is provided in the same manner as in the first embodiment. Further, the light amount range in which the focus detection signal is not saturated is further expanded as described above.

Note that, although the two gain change circuits are arranged for the high gain and the low gain in the present embodiment, the form of the gain change circuit is not limited thereto. For example, a gain change circuit may be common to the high gain and the low gain, and the gain may be switched in accordance with a timing of reading. Further, a scheme to change the gain is not limited to a variable gain change circuit as with the gain change circuit 40. For example, the conversion range of AD conversion may be changed by changing the range of the potential of the reference signal output from the reference signal generation circuit 23.

Third Embodiment

A photoelectric conversion device according to a third embodiment will be described with reference to FIG. 11A and FIG. 11B. In the photoelectric conversion device of the third embodiment, the timing of AD conversion on a reset signal at the low gain differs from the first embodiment and the second embodiment. This can reduce noise at the low gain. In the following, differences of the present embodiment from the first embodiment and the second embodiment will be mainly described.

Figure 11A:
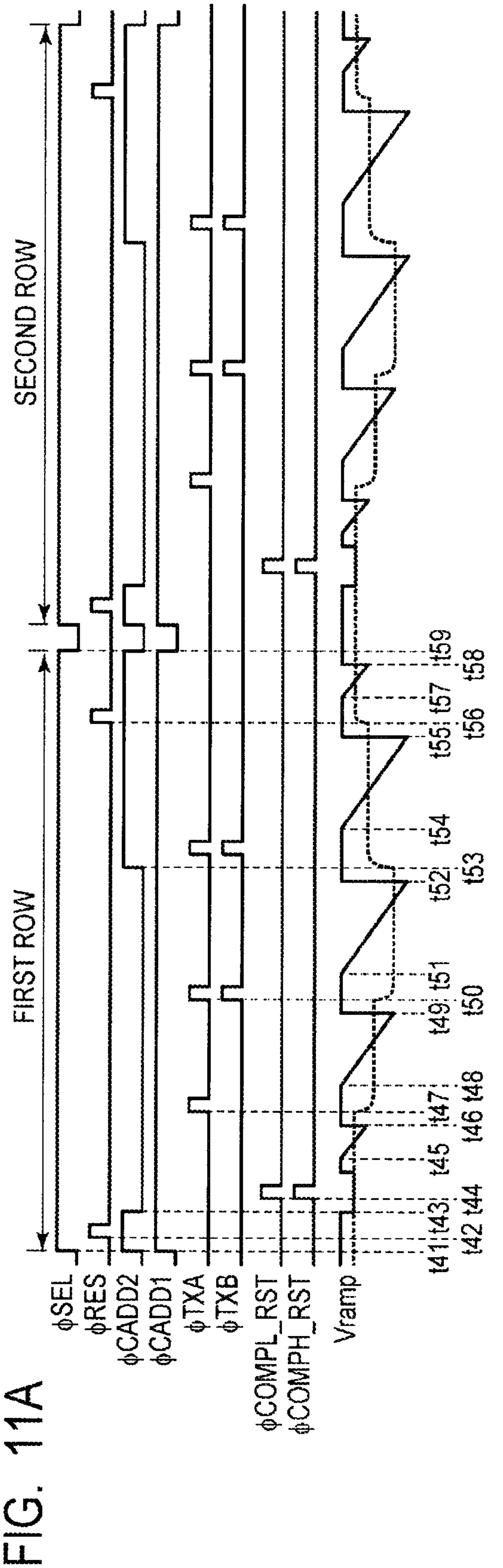
FIG. 11A and FIG. 11B are timing charts illustrating a drive method of a photoelectric conversion device according to a third embodiment.
Figure 11B:
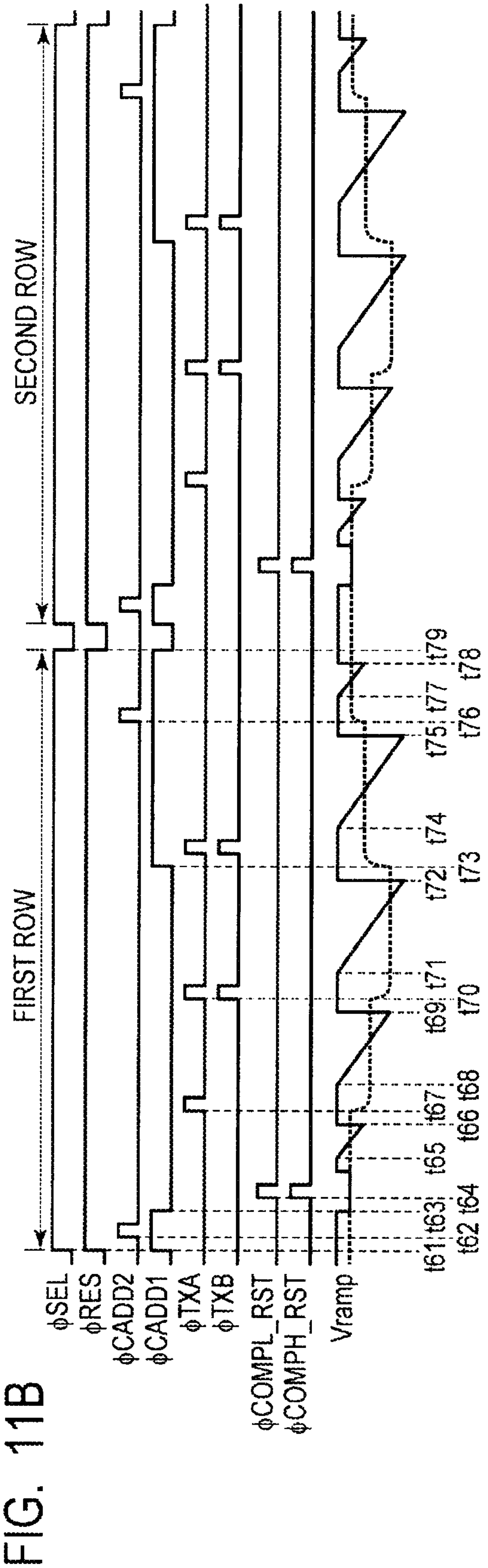

FIG. 11A and FIG. 11B are timing charts illustrating a drive method of the photoelectric conversion device according to the present embodiment. FIG. 11A illustrates the drive method in the high-illuminance drive mode, and FIG. 11B illustrates the drive method in the low-illuminance drive mode. The drive method of the present embodiment will be described while description of the same operations as those in FIG. 4A and FIG. 4B of the first embodiment will be omitted as appropriate. First, the high-illuminance drive mode will be described with reference to FIG. 11A. In the present embodiment, AD conversion on a reset signal at the low gain is performed after AD conversion on a mixed signal at the low gain.

At time t43, the control signal ϕCADD2 becomes the low level, and the capacitance addition transistor M6 is switched off. This results in a high gain state, and the reset signal at the high gain is output to the output line 12.

At time t44, the control signals ϕCOMPL_RST, ϕCOMPH_RST become the high level. Accordingly, the comparators 31L, 31H are reset. Then, in the same manner as FIG. 4A, AD conversion on the reset signal at the high gain, AD conversion on the focus detection signal at the high gain, AD conversion on the mixed signal at the high gain, and AD conversion on the mixed signal at the low gain are sequentially performed. The digital signal of a result of the AD conversion on the mixed signal at the low gain is held in the memory circuit 32L.

At time t56, the control signal ϕRES becomes the high level, and the reset transistor M2 is switched on. Accordingly, the potential of the floating diffusion FD is reset, and the reset signal at the low gain is output to the output line 12.

In the period from time t57 to time t58, AD conversion on the reset signal at the low gain is performed. When the AD conversion on the reset signal at the low gain ends, a digital signal of the result of the AD conversion and also the mixed signal at the low gain held in the memory circuit 32L are sequentially transferred to the signal processing circuit 27.

In the present embodiment, AD conversion on a reset signal at the low gain is performed after AD conversion on a mixed signal and resetting of the floating diffusion FD. Thus, noise charges at the AD conversion on the mixed signal and noise charges at the AD conversion on the reset signal differ from each other. However, since optical shot noise due to variation in incidence of photons is predominant in signal mixture at the low gain used when the light amount is large, influence due to the difference in the noise charge is not notable. On the other hand, since AD conversion on a reset signal can be performed immediately after AD conversion on a mixed signal at the low gain in the present embodiment, noise occurring due to a time difference between the AD conversion on the mixed signal and the AD conversion on the reset signal can be more effectively reduced. Examples of the noise occurring due to such a time difference may be noise appearing as horizontal stripes on an image due to power source noise and may be noise that increases over time due to a defect in the diffusion layer of the floating diffusion FD and the added capacitor.

Also in the low-illuminance drive mode illustrated in FIG. 11B, AD conversion on a reset signal at the low gain is performed after AD conversion on a mixed signal and resetting of the floating diffusion FD in the same manner as in FIG. 11A. Therefore, the effect of reduced noise occurring due to a time difference between the AD conversion operations can be obtained in the same manner as in the high-illuminance drive mode.

In the present embodiment, a photoelectric conversion device that has a pixel capable of outputting a signal used for focus detection and may more suitably expand the dynamic range is provided in the same manner as in the first embodiment and the second embodiment. Further, noise occurring due to a time difference between the AD conversion operations as described above is further reduced.

Fourth Embodiment

Figure 12:
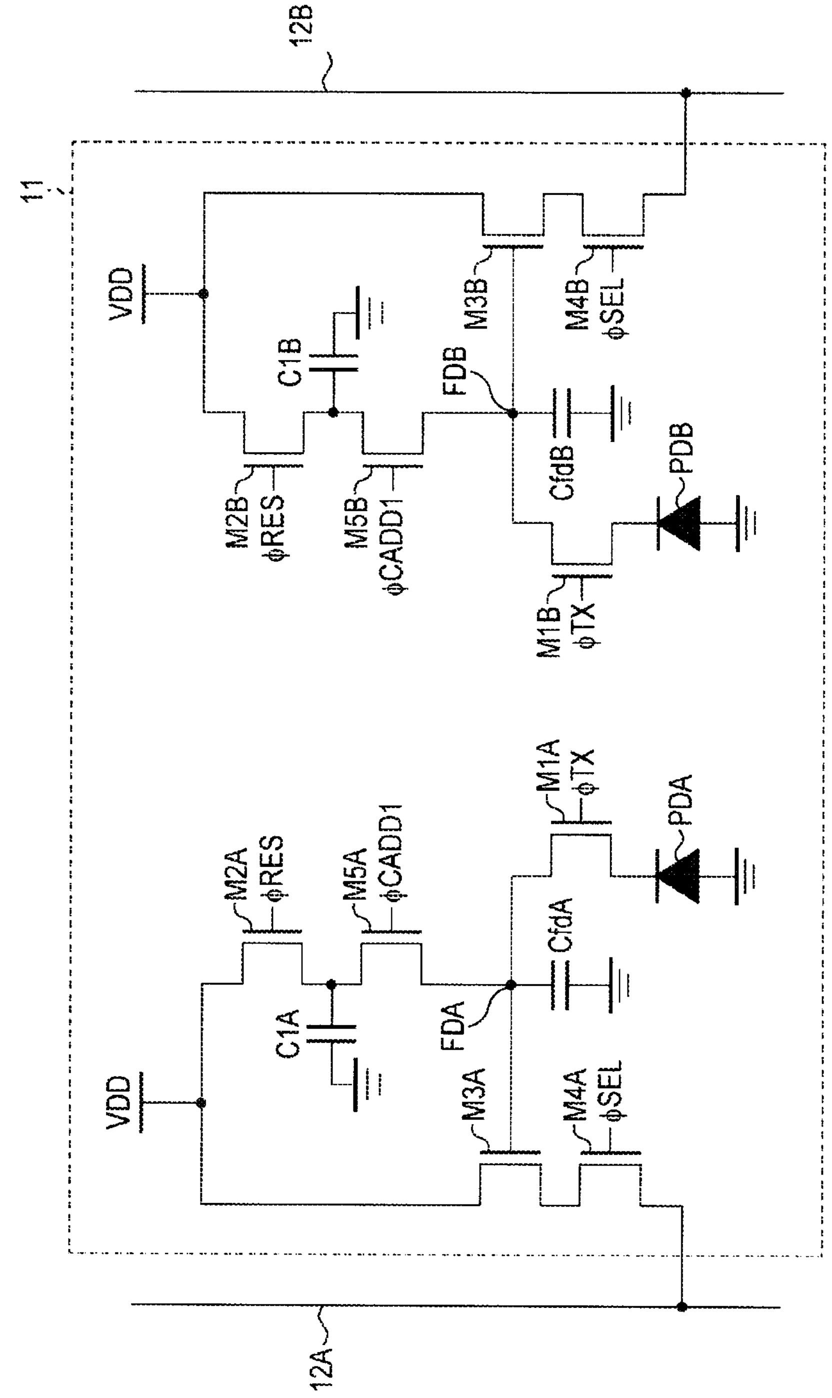
FIG. 12 is a circuit diagram illustrating a configuration of a pixel according to a fourth embodiment.

A photoelectric conversion device according to a fourth embodiment will be described with reference to FIG. 12 to FIG. 14. The photoelectric conversion device of the fourth embodiment relates to a modified example of a circuit configuration of the pixel 11 of the first to third embodiments.

First, the configuration of the pixel 11 of the present embodiment will be described with reference to FIG. 12 and FIG. 13. FIG. 12 is a circuit diagram illustrating the configuration of the pixel 11 according to the present embodiment. FIG. 13 is a schematic plan view illustrating the layout of a unit pixel according to the present embodiment. The pixel 11 of the present embodiment has separate reading circuits for the photoelectric conversion element PDA and the photoelectric conversion element PDB, respectively. Components associated with the photoelectric conversion element PDA are labeled with "A" at the end of their references. Similarly, components associated with the photoelectric conversion element PDB are labeled with "B" at the end of their references. That is, the pixel 11 has the photoelectric conversion elements PDA, PDB, transfer transistors M1A, M1B, reset transistors M2A, M2B, amplifier transistors M3A, M3B, selection transistors M4A, M4B, and capacitance addition transistors M5A, M5B.

The node at which the drain of the transfer transistor M1A, the source of the capacitance addition transistor M5A (first transistor), and the gate of the amplifier transistor M3A are connected is a floating diffusion FDA. Charges accumulated in the photoelectric conversion element PDA are transferred to the floating diffusion FDA (first floating diffusion). A signal associated with the photoelectric conversion element PDA is output to an output line 12A.

The node at which the drain of the transfer transistor M1B, the source of the capacitance addition transistor M5B (second transistor), and the gate of the amplifier transistor M3B are connected is a floating diffusion FDB. Charges accumulated in the photoelectric conversion element PDB are transferred to the floating diffusion FDB (second floating diffusion). A signal associated with the photoelectric conversion element PDB is output to an output line 12B different from the output line 12A.

Further, in the present embodiment, no transistor corresponding to the capacitance addition transistor M6 in FIG. 2 is arranged. Therefore, in the present embodiment, the capacitance at the floating diffusion FD can be changed between two levels. Since the circuit configuration is substantially the same as that illustrated in FIG. 2 except for features that the capacitance addition transistor M6 is not arranged and two reading circuits are arranged separately, detailed description of the circuit configuration will be omitted.

The common control signal ϕTX is input to the gates of the transfer transistors M1A, M1B. The common control signal ϕRES is input to the gates of the reset transistors M2A, M2B. The common control signal ϕSEL is input to the gates of the selection transistors M4A, M4B. The common control signal ϕCADD1 is input to the gates of the capacitance addition transistors M5A, M5B.

Note that, since a reading circuit is arranged for each of the photoelectric conversion elements PDA, PDB, two output lines 12A, 12B are arranged for each pixel 11. Two of the comparator 31L for the low gain and the comparator 31H for the high gain are connected to the output line 12A. Similarly, two comparators 31L, 31H that are different from the above two comparators are connected to the output line 12B. That is, the circuit scale of the AD conversion circuit 30 per pixels 11 on a single column is doubled.

In the present embodiment, the charge accumulated in the photoelectric conversion element PDA and the charge accumulated in the photoelectric conversion element PDB are read independently of each other. Therefore, the process to mix these charges within the pixel 11 is not performed. Accordingly, the signal processing circuit 27 calculates a digital signal for image generation corresponding to the mixed signal by summing a digital signal of a result of AD conversion on a signal from the photoelectric conversion element PDA and a digital signal of a result of AD conversion on a signal from the photoelectric conversion element PDB.

Figure 13:
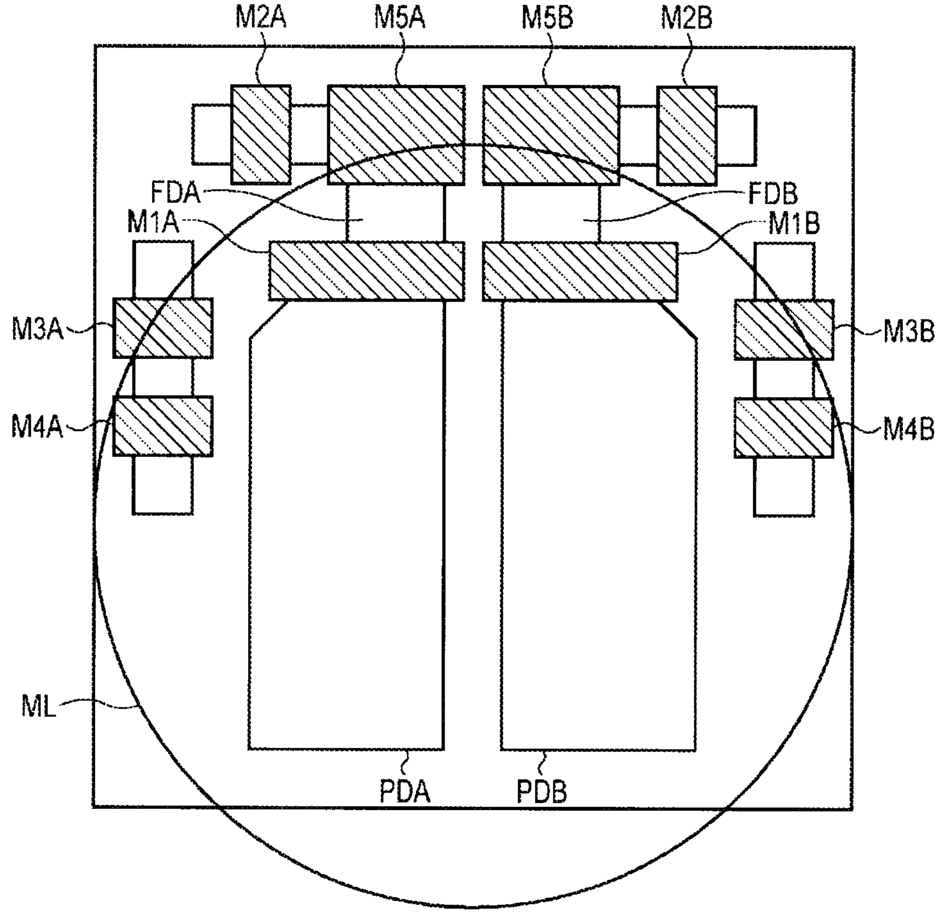
FIG. 13 is a schematic plan view illustrating a layout of a pixel according to the fourth embodiment.
Figure 14:
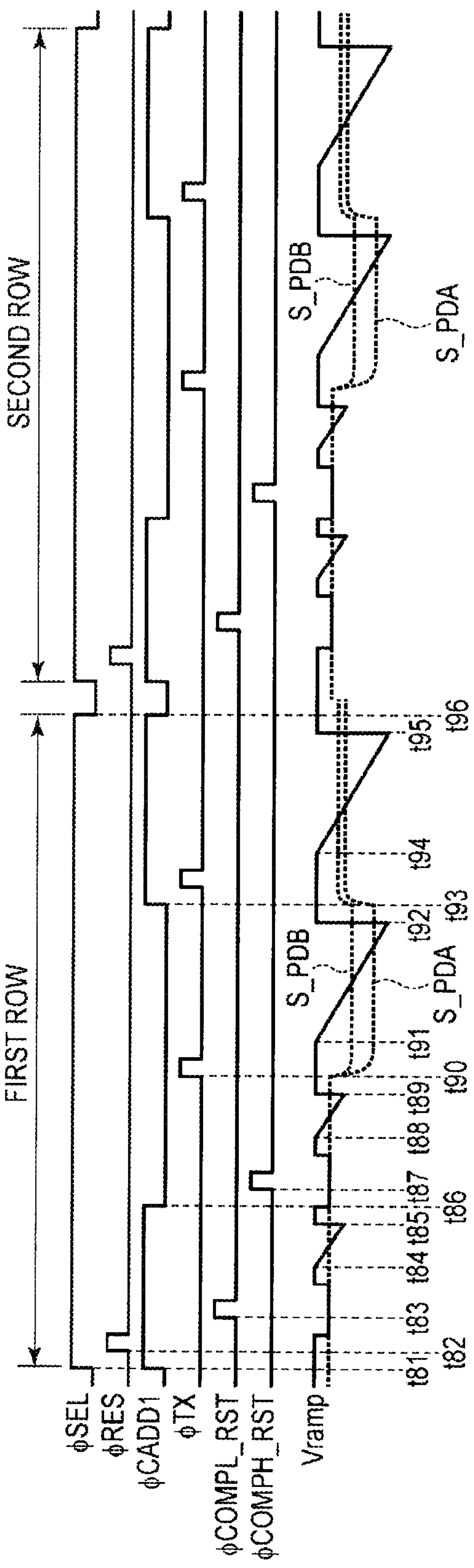
FIG. 14 is a timing chart illustrating a drive method of a photoelectric conversion device according to the fourth embodiment.

FIG. 13 schematically illustrates the arrangement of the photoelectric conversion elements PDA, PDB, the floating diffusions FDA, FDB, respective transistors, and the microlens ML in the planar view. The photoelectric conversion elements PDA, PDB are arranged in association with a single microlens ML in the same manner as FIG. 3. As illustrated in FIG. 13, it is desirable that the reading circuit associated with the photoelectric conversion element PDA and the reading circuit associated with the photoelectric conversion element PDB be arranged line-symmetrically in terms of a reduction of the performance difference between two reading circuits.

Next, the operation of the photoelectric conversion device according to the present embodiment will be described with reference to FIG. 14 while the description for the same operation as those in FIG. 4A and FIG. 4B of the first embodiment will be omitted as appropriate. FIG. 14 is a timing chart illustrating a drive method of the photoelectric conversion device according to the present embodiment. In the photoelectric conversion device of the present embodiment, unlike the first to third embodiments, a common operation is performed thereon without distinction between the high-illuminance drive mode and the low-illuminance drive mode. FIG. 14 illustrates an example in which more light enters the photoelectric conversion element PDA than the photoelectric conversion element PDB. The dashed lines labeled with references "S_PDA" and "S_PDB" in FIG. 14 illustrate the potentials of the output line 12A and the output line 12B, respectively.

At time t81, the control signal ϕSEL becomes the high level. Accordingly, the selection transistor M4A, M4B on the corresponding row are switched on, a reading operation of signals from the pixels 11 on the first row is started. Further, at time t81, the control signal ϕCADD1 becomes the high level, and the capacitance addition transistors M5A, M5B are switched on. Accordingly, the capacitors C1A, C1B are connected to the floating diffusions FDA, FDB, respectively, and the low gain state is obtained.

At time t82, the control signal ϕRES becomes the high level, and the reset transistors M2A, M2B are switched on. Accordingly, the potentials of the floating diffusions FDA, FDB are reset.

At time t83, the control signal ϕCOMPL_RST becomes the high level. Accordingly, the comparator 31L for the low gain is reset. Then, in the period from time t84 to time t85, AD conversion on the reset signal at the low gain is performed.

At time t86, the control signal ϕCADD1 becomes the low level, and the capacitance addition transistors M5A, M5B are switched off. Accordingly, the connection of the capacitors C1A, C1B to the floating diffusions FDA, FDB is canceled, and the high gain state is obtained.

At time t87, the control signal ϕCOMPH_RST becomes the high level. Accordingly, the comparator 31H for the high gain is reset. Then, in the period from time t88 to time t89, AD conversion on the reset signal at the high gain is performed.

At time t90, the control signal ϕTX becomes the high level, and the transfer transistors M1A, M1B are switched on. Accordingly, charges accumulated by photoelectric conversion in the photoelectric conversion elements PDA, PDB are transferred to the floating diffusions FDA, FDB, respectively.

In a period from time t91 to time t92, AD conversion on the focus detection signal at the high gain is performed. The digital signal of the result of the AD conversion on the focus detection signal at the high gain is transferred to the signal processing circuit 27 together with the digital signal of the result of the AD conversion on the reset signal at the high gain, and a subtraction process is performed. The signal processing circuit 27 then calculates a digital signal corresponding to the mixed signal at the high gain by summing the focus detection signal obtained after the subtraction process based on the photoelectric conversion element PDA and the focus detection signal obtained after the subtraction process based on the photoelectric conversion element PDB.

At time t93, the control signal ϕCADD1 becomes the high level, and the capacitance addition transistors M5A, M5B are switched on. Accordingly, the capacitors C1A, C1B are connected to the floating diffusions FDA, FDB, respectively, and the low gain state is obtained.

In the period from time t94 to time t95, AD conversion on the focus detection signal at the low gain is performed. The digital signal of the result of the AD conversion on the focus detection signal at the low gain is transferred to the signal processing circuit 27 together with the digital signal of the result of the AD conversion on the reset signal at the low gain, and a subtraction process is performed. The signal processing circuit 27 then calculates a digital signal corresponding to the mixed signal at the low gain by summing the focus detection signal obtained after the subtraction process based on the photoelectric conversion element PDA and the focus detection signal obtained after the subtraction process based on the photoelectric conversion element PDB.

At time t96, the control signals ϕSEL, ϕCADD1 become the low level, and the selection transistors M4A, M4B and the capacitance addition transistors M5A, M5B are switched off. Accordingly, the reading operation of the pixels 11 on the first row ends. A period for a reading operation of the second row is then started, however, since the operation thereof is substantially the same as that of the first row, the description thereof will be omitted.

In the photoelectric conversion device of the present embodiment, a focus detection signal at the low gain and a focus detection signal at the high gain can be read independently of each of the photoelectric conversion element PDA and the photoelectric conversion element PDB. Further, addition of these signals enables calculation of a mixed signal at the low gain and a mixed signal at the high gain. Therefore, in the present embodiment, unlike the first to third embodiments, since a focus detection signal at the low gain can also be read, the light amount range that can suitably acquire a focus detection signal can be expanded. More specifically, unless the charge amount that can be accumulated in the photoelectric conversion element PDA and the photoelectric conversion element PDB is exceeded, the focus detection signal can be acquired up to the same range as the AD conversion range of a mixed signal.

Since signals are read from the photoelectric conversion element PDA and the photoelectric conversion element PDB independently of each other, noise components in respective photoelectric conversion elements may be superimposed when a mixed signal is calculated. In the present embodiment, however, since the number of transfer transistors connected to the floating diffusion FD is reduced, the capacitance Cfd can be further reduced. Accordingly, since the gain in the pixel 11 can be further increased, expansion of the dynamic range by switching of the floating diffusion FD can be more effectively performed.

As set forth, also in the present embodiment, a photoelectric conversion device that has a pixel capable of outputting a signal used for focus detection and may more suitably expand the dynamic range is provided.

Fifth Embodiment

Figure 15:
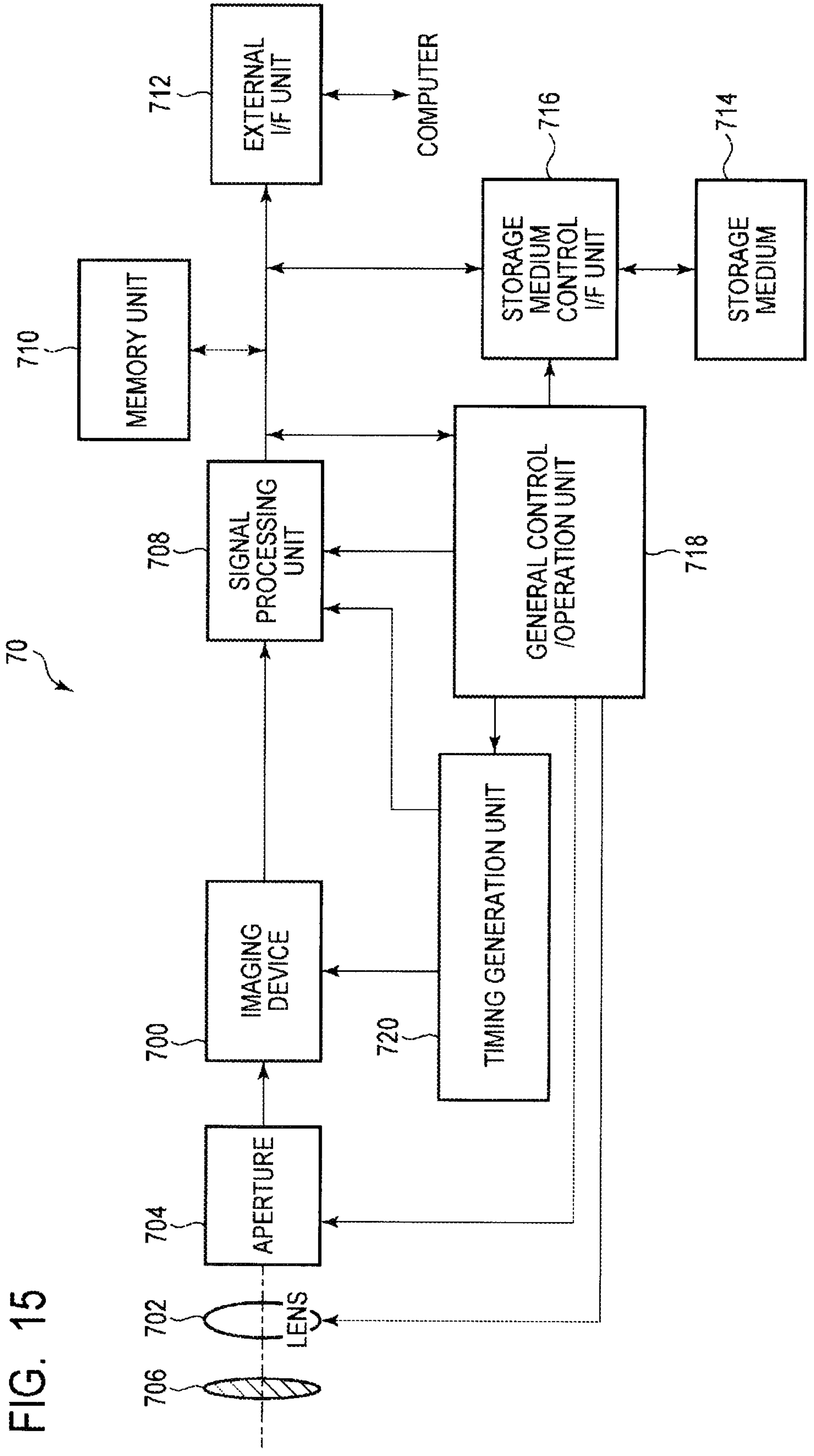
FIG. 15 is a block diagram of equipment according to a fifth embodiment.

The photoelectric conversion devices in the embodiments described above are applicable to various equipment. The equipment may be a digital still camera, a digital camcorder, a camera head, a copier machine, a facsimile machine, a mobile phone, an on-vehicle camera, an observation satellite, a surveillance camera, or the like. FIG. 15 illustrates a block diagram of a digital still camera as an example of the equipment.

Equipment 70 illustrated in FIG. 15 includes a barrier 706, a lens 702, an aperture 704, and an imaging device 700 (an example of the photoelectric conversion device). Further, the equipment 70 further includes a signal processing unit or circuit (processing device) 708, a timing generation unit or circuit 720, a general control/operation unit or circuit 718 (control device), a memory unit or circuit 710 (storage device), a storage medium control I/F unit 716, a storage medium 714, and an external I/F unit or circuit 712. At least one of the barrier 706, the lens 702, and the aperture 704 is an optical device compatible with the equipment. The barrier 706 protects the lens 702, and the lens 702 captures an optical image of a subject onto the imaging device 700. The aperture 704 can change the amount of light that has passed through the lens 702. The imaging device 700 is configured as with the embodiments described above and converts an optical image captured by the lens 702 into image data (image signal). The signal processing circuit 708 performs various correction, data compression, or the like on imaging data output from the imaging device 700. The timing generation circuit 720 outputs various timing signals to the imaging device 700 and the signal processing circuit 708. The general control/operation circuit 718 controls the overall digital still camera, and the memory circuit 710 temporarily stores image data. The storage medium control I/F circuit 716 is an interface used for storage or reading of image data on the storage medium 714, and the storage medium 714 is a removable storage medium such as a semiconductor memory used for storage or reading of imaging data. The external I/F circuit 712 is an interface used for communicating with an external computer or the like. The timing signal or the like may be input from the outside of the equipment. Further, the equipment 70 may further have a display device (a monitor, an electronic view finder, or the like) configured to display information obtained by the photoelectric conversion device. The equipment has at least the photoelectric conversion device. Furthermore, the equipment 70 has at least any of the optical device, the control device, the processing device, the display device, the storage device, and a mechanical device configured to operate based on information obtained by the photoelectric conversion device. The mechanical device is a movable part (for example, a robot arm) configured to operate in response to receiving a signal from the photoelectric conversion device.

Each pixel may include a plurality of photoelectric conversion elements (the first photoelectric conversion element and the second photoelectric conversion element). The signal processing circuit 708 may be configured to process a pixel signal based on charges generated by the first photoelectric conversion element and a pixel signal based on charges generated by the second photoelectric conversion element to acquire distance information on the distance from the imaging device 700 to a subject.

Sixth Embodiment

Figure 16A:
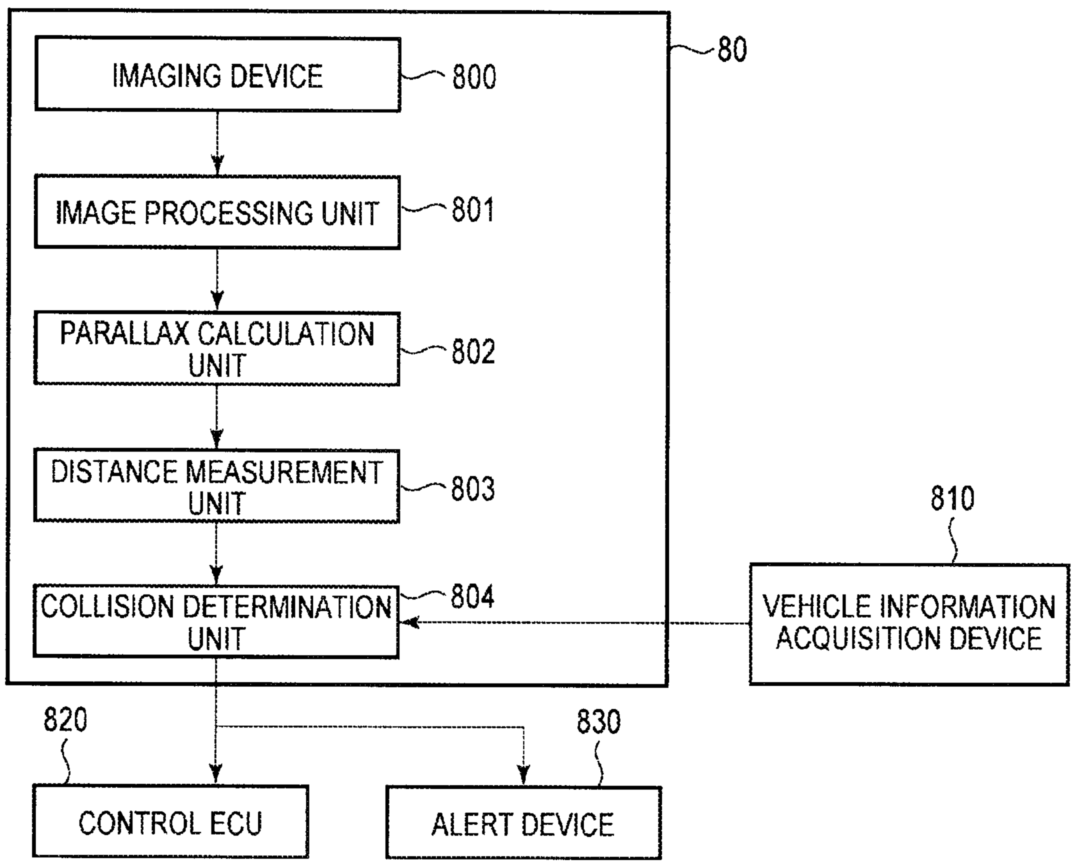
FIG. 16A and FIG. 16B are block diagrams of equipment according to a sixth embodiment.
Figure 16B:
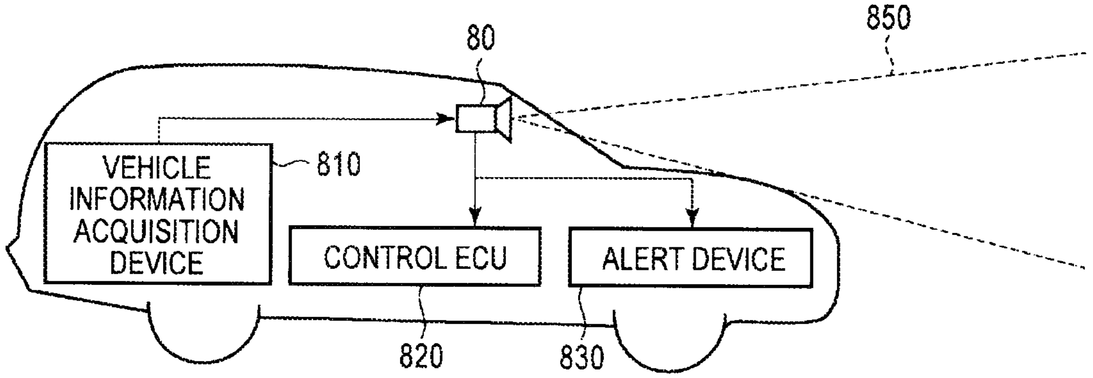

FIG. 16A and FIG. 16B are block diagrams of the equipment related to an on-vehicle camera in the present embodiment. Equipment 80 has an imaging device 800 (an example of the photoelectric conversion device) of the embodiments described above and a signal processing device (processing device) that processes a signal from the imaging device 800. The equipment 80 has an image processing unit or circuit 801 that performs image processing on a plurality of image data acquired by the imaging device 800 and a parallax calculation unit or circuit 802 that calculates a parallax (a phase difference of parallax images) from the plurality of image data acquired by the equipment 80. Further, the equipment 80 has a distance measurement unit or circuit 803 that calculates a distance to an object based on the calculated parallax and a collision determination unit or circuit 804 that determines whether or not there is a collision possibility based on the calculated distance. Herein, the parallax calculation circuit 802 and the distance measurement circuit 803 represent an example of a distance information acquisition circuit that acquires distance information on the distance to an object. That is, the distance information is information on a parallax, a defocus amount, a distance to an object, or the like. The collision determination circuit 804 may use any of the distance information to determine the collision possibility. The distance information acquisition circuit may be implemented by dedicatedly designed hardware or may be implemented by a software module. Further, the distance information acquisition circuit may be implemented by a field programmable gate array (FPGA) or an application specific integrated circuit (ASIC) or may be implemented by a combination thereof.

The equipment 80 is connected to the vehicle information acquisition device 810 and can acquire vehicle information such as a vehicle speed, a yaw rate, a steering angle, or the like. Further, the equipment 80 is connected to a control ECU 820, which is a control device that outputs a control signal for causing a vehicle to generate braking force based on a determination result by the collision determination circuit 804. Further, the equipment 80 is also connected to an alert device 830 that issues an alert to the driver based on a determination result by the collision determination circuit 804. For example, when the collision probability is high as the determination result of the collision determination circuit 804, the control ECU 820 performs vehicle control to avoid a collision or reduce damage by applying a brake, retracting an accelerator, suppressing engine power, or the like. The alert device 830 alerts a user by sounding an alert such as a sound, displaying alert information on a screen of a car navigation system or the like, providing vibration to a seat belt or a steering wheel, or the like. The equipment 80 functions as a control unit or circuit that controls the operation of controlling a vehicle as described above.

In the present embodiment, an image of an area around a vehicle, for example, a front area or a rear area is captured by using the equipment 80. FIG. 16B illustrates equipment when capturing an image of a front area of a vehicle (a capturing area 850). The vehicle information acquisition device 810 as an imaging control unit or circuit instructs the equipment 80 or the imaging device 800 to perform an image capturing operation. Such a configuration can further improve the ranging accuracy.

Although the example of control to avoid a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an aircraft, a satellite, an industrial robot and a consumer use robot, or the like, for example. In addition, the equipment can be widely applied to equipment which utilizes object recognition or biometric recognition, such as an intelligent transportation system (ITS), a surveillance system, or the like without being limited to moving units.

Modified Embodiment

The disclosure is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the disclosure.

The disclosed content of the present specification encompasses a complement set of the concept described in the present specification. That is, for example, when there is a statement of "A is B" (A=B) in the present specification, it is intended to imply that the present specification discloses or suggests "A is not B" even when the statement of "A is not B" (A≠B) is omitted. Because, when "A is B" is stated, it is assumed that a case where "A is not B" has been taken into consideration.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-047961, filed Mar. 24, 2022, which is hereby incorporated by reference herein in its entirety.

What is claimed is:

1. A photoelectric conversion device comprising:

a plurality of pixels, each of the pixels including a first photoelectric conversion element, a second photoelectric conversion element, a microlens that guides incident light to the first photoelectric conversion element and the second photoelectric conversion element, a floating diffusion to which charges accumulated in at least one of the first photoelectric conversion element and the second photoelectric conversion element are transferred, a first transistor that, when switched on, adds a capacitance to a node of the floating diffusion; and a second transistor that, when switched on, adds a capacitance to the node of the floating diffusion; and a signal line to which signals are read from the plurality of pixels, wherein in a second period after a first period in which a signal is read to the signal line from one subset of the plurality of pixels, a signal is read to the signal line from another subset of the plurality of pixels, wherein in the first period, a first reading operation, in which a signal based on charges transferred to the floating diffusion is read at a first conversion gain, and a second reading operation, in which a signal based on charges transferred to the floating diffusion is read at a second conversion gain, are performed, wherein the photoelectric conversion device is configured to operate in a first mode and a second mode, wherein in the first reading operation of the first mode, the first transistor is in an on-state and the second transistor is in an off-state, wherein in the second reading operation of the first mode, the first transistor is in the on-state and the second transistor is in an on-state, wherein in the first reading operation of the second mode, the first transistor is in an off-state and the second transistor is in the off-state, and wherein in the second reading operation of the second mode, the first transistor is in the on-state and the second transistor is in the off-state.

2. The photoelectric conversion device according to claim 1, wherein each of the plurality of pixels has an amplifier transistor, the floating diffusion being connected to a control node of the amplifier transistor, and a selection transistor connected to the amplifier transistor, and wherein the first period is a period from a time that the selection transistor transitions from an off-state to an on-state to a time that the selection transistor transitions from the on-state to an off-state.

3. The photoelectric conversion device according to claim 1, wherein the plurality of pixels are arranged across a plurality of rows, and wherein the one subset of the plurality of pixels are pixels arranged on one of the plurality of rows.

4. The photoelectric conversion device according to claim 1, wherein the plurality of pixels are arranged across a plurality of rows, and wherein the one subset of the plurality of pixels are pixels arranged on two or more of the plurality of rows.

5. The photoelectric conversion device according to claim 1, wherein the second reading operation is performed after the first reading operation is performed on the same charges as those transferred to the floating diffusion.

6. The photoelectric conversion device according to claim 1, wherein the first reading operation based on charges accumulated in the first photoelectric conversion element, the first reading operation based on charges generated by mixing charges accumulated in the first photoelectric conversion element and charges accumulated in the second photoelectric conversion element, and the second reading operation based on charges generated by mixing charges accumulated in the first photoelectric conversion element and charges accumulated in the second photoelectric conversion element are performed in this order.

7. The photoelectric conversion device according to claim 6, wherein the second reading operation based on charges accumulated only in the first photoelectric conversion element is not performed.

8. The photoelectric conversion device according to claim 1, wherein a ratio of the first conversion gain to the second conversion gain is smaller than a ratio of a maximum amount of charges to be accumulated in the first photoelectric conversion element and the second photoelectric conversion element to a maximum amount of charges to be accumulated in the first photoelectric conversion element.

9. The photoelectric conversion device according to claim 1 further comprising a gain change circuit that changes a gain for a signal output based on charges transferred to the floating diffusion, wherein the gain change circuit reduces the gain to be lower when the first reading operation is performed than when the second reading operation is performed.

10. The photoelectric conversion device according to claim 1, wherein a third reading operation based on a reset state of the floating diffusion is performed at the second conversion gain before transfer of charges for the second reading operation.

11. The photoelectric conversion device according to claim 1, wherein a third reading operation based on a reset state of the floating diffusion is performed at the second conversion gain after the second reading operation.

12. The photoelectric conversion device according to claim 1, wherein at least one of the first conversion gain and the second conversion gain differs between the first mode and the second mode.

13. The photoelectric conversion device according to claim 12, wherein the first mode is a high-illuminance drive mode, wherein the second mode is a low-illuminance drive mode used when an incident light amount is smaller than in a case of the first mode, and wherein at least one of the first conversion gain and the second conversion gain is set higher in a case of the second mode than in a case of the first mode.

14. The photoelectric conversion device according to claim 1, wherein the first conversion gain is higher than the second conversion gain.

15. Equipment comprising:

the photoelectric conversion device according to claim 1; and at least any one of:

an optical device adapted for the photoelectric conversion device, a control device configured to control the photoelectric conversion device, a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

16. The equipment according to claim 15, wherein the processing device processes image signals, which are generated by a plurality of photoelectric conversion elements, respectively and acquires distance information on a distance from the photoelectric conversion device to an object.

17. The photoelectric conversion device according to claim 6, wherein a first analog-to-digital conversion for a signal read by the first reading operation based on charges accumulated in the first photoelectric conversion element and a second analog-to-digital conversion for a signal read by the first reading operation based on charges accumulated in the first photoelectric conversion element and charges accumulated in the second photoelectric conversion element are performed, and wherein a range of a potential of a reference signal used in the first analog-to-digital conversion is smaller than a range of a potential of a reference signal used in the second analog-to-digital conversion.

18. A photoelectric conversion device comprising:

a first photoelectric conversion element;

a second photoelectric conversion element;

a microlens that guides incident light to the first photoelectric conversion element and the second photoelectric conversion element;

a floating diffusion to which charges accumulated in at least one of the first photoelectric conversion element and the second photoelectric conversion element are transferred;

a first transistor that, when switched on, adds a capacitance to a node of the floating diffusion; and a second transistor that, when switched on, adds a capacitance to the node of the floating diffusion, wherein in a period from a time that resetting of the floating diffusion is canceled to a time that resetting of the floating diffusion is next performed, a first reading operation, in which a signal based on charges transferred to the floating diffusion is read at a first conversion gain, and a second reading operation, in which a signal based on charges transferred to the floating diffusion is read at a second conversion gain, are performed, wherein the photoelectric conversion device is configured to operate in a first mode and a second mode, wherein in the first reading operation of the first mode, the first transistor is in an on-state and the second transistor is in an off-state, wherein in the second reading operation of the first mode, the first transistor is in the on-state and the second transistor is in an on-state, wherein in the first reading operation of the second mode, the first transistor is in an off-state and the second transistor is in the off-state, and wherein in the second reading operation of the second mode, the first transistor is in the on-state and the second transistor is in the off-state.

19. A photoelectric conversion device comprising:

a plurality of pixels, each of the pixels including a first photoelectric conversion element, a second photoelectric conversion element, a microlens that guides incident light to the first photoelectric conversion element and the second photoelectric conversion element, a floating diffusion to which charges accumulated in at least one of the first photoelectric conversion element and the second photoelectric conversion element are transferred, and a transistor that, when switched on, adds a capacitance to a node of the floating diffusion; and a signal line to which signals are read from the plurality of pixels, wherein in a second period after a first period in which a signal is read to the signal line from one subset of the plurality of pixels, a signal is read to the signal line from another subset of the plurality of pixels, wherein in the first period, a first reading operation, in which a signal based on charges transferred to the floating diffusion is read at a first conversion gain caused by a state where the transistor is in an off-state, and a second reading operation, in which a signal based on charges transferred to the floating diffusion is read at a second conversion gain caused by a state where the transistor is in an on-state, are performed, wherein the first reading operation based on charges accumulated in the first photoelectric conversion element, the first reading operation based on charges generated by mixing charges accumulated in the first photoelectric conversion element and charges accumulated in the second photoelectric conversion element, and the second reading operation based on charges generated by mixing charges accumulated in the first photoelectric conversion element and charges accumulated in the second photoelectric conversion element are performed in this order, wherein a first analog-to-digital conversion for a signal read by the first reading operation based on charges accumulated in the first photoelectric conversion element and a second analog-to-digital conversion for a signal read by the first reading operation based on charges accumulated in the first photoelectric conversion element and charges accumulated in the second photoelectric conversion element are performed, and wherein a range of a potential of a reference signal used in the first analog-to-digital conversion is smaller than a range of a potential of a reference signal used in the second analog-to-digital conversion.

20. The photoelectric conversion device according to claim 19 comprising:

a plurality of floating diffusions including a first floating diffusion to which charges are transferred from the first photoelectric conversion element and a second floating diffusion to which charges are transferred from the second photoelectric conversion element; and a plurality of transistors including a first transistor that, when switched on, adds a capacitance to a node of the first floating diffusion and a second transistor that, when switched on, adds a capacitance to a node of the second floating diffusion.

21. The photoelectric conversion device according to claim 20, wherein the first reading operation based on charges accumulated in the first photoelectric conversion element, the first reading operation based on charges accumulated in the second photoelectric conversion element, the second reading operation based on charges accumulated in the first photoelectric conversion element, and the second reading operation based on charges accumulated in the second photoelectric conversion element are performed.

22. A photoelectric conversion device comprising:

a first photoelectric conversion element;

a second photoelectric conversion element;

a microlens that guides incident light to the first photoelectric conversion element and the second photoelectric conversion element;

a floating diffusion to which charges accumulated in at least one of the first photoelectric conversion element and the second photoelectric conversion element are transferred; and a transistor that, when switched on, adds a capacitance to a node of the floating diffusion, wherein in a period from a time that resetting of the floating diffusion is canceled to a time that resetting of the floating diffusion is next performed, a first reading operation, in which a signal based on charges transferred to the floating diffusion is read at a first conversion gain caused by a state where the transistor is in an off-state, and a second reading operation, in which a signal based on charges transferred to the floating diffusion is read at a second conversion gain caused by a state where the transistor is in an on-state, are performed, wherein the first reading operation based on charges accumulated in the first photoelectric conversion element, the first reading operation based on charges generated by mixing charges accumulated in the first photoelectric conversion element and charges accumulated in the second photoelectric conversion element, and the second reading operation based on charges generated by mixing charges accumulated in the first photoelectric conversion element and charges accumulated in the second photoelectric conversion element are performed in this order, wherein a first analog-to-digital conversion for a signal read by the first reading operation based on charges accumulated in the first photoelectric conversion element and a second analog-to-digital conversion for a signal read by the first reading operation based on charges accumulated in the first photoelectric conversion element and charges accumulated in the second photoelectric conversion element are performed, and wherein a range of a potential of a reference signal used in the first analog-to-digital conversion is smaller than a range of a potential of a reference signal used in the second analog-to-digital conversion.

* * * * *